United States Patent
Donkers et al.

(10) Patent No.: US 11,990,536 B2
(45) Date of Patent: May 21, 2024

(54) BIPOLAR TRANSISTORS WITH MULTILAYER COLLECTORS

(71) Applicant: NXP B.V., Eindhoven (NL)

(72) Inventors: Johannes Josephus Theodorus Marinus Donkers, Valkenswaard (NL); Petrus Hubertus Cornelis Magnee, Malden (NL); Ronald Willem Arnoud Werkman, Groesbeek (NL)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 17/646,716

(22) Filed: Dec. 31, 2021

(65) Prior Publication Data

US 2023/0215937 A1    Jul. 6, 2023

(51) Int. Cl.
*H01L 29/737* (2006.01)
*H01L 27/06* (2006.01)
*H01L 29/08* (2006.01)
*H01L 29/66* (2006.01)

(52) U.S. Cl.
CPC ........ *H01L 29/737* (2013.01); *H01L 27/0623* (2013.01); *H01L 29/0821* (2013.01); *H01L 29/66242* (2013.01)

(58) Field of Classification Search
CPC ............... H01L 29/737; H01L 27/0623; H01L 29/0821; H01L 29/66242; H01L 29/1004; H01L 29/16; H01L 29/7371
See application file for complete search history.

(56) References Cited

U.S. PATENT DOCUMENTS

| | | | |
|---|---|---|---|
| 7,923,339 B2 | 4/2011 | Meunier-Beillard et al. | |
| 7,932,156 B2 | 4/2011 | Donkers et al. | |
| 7,956,399 B2 | 6/2011 | Van Noort et al. | |
| 9,041,149 B2 | 5/2015 | Boccardi et al. | |
| 9,224,634 B2 | 12/2015 | Sonsky | |
| 10,217,852 B1* | 2/2019 | Liu | H01L 29/7378 |
| 2003/0082882 A1* | 5/2003 | Babcock | H01L 29/7375 |
| | | | 257/E21.372 |
| 2005/0250289 A1 | 11/2005 | Babcock et al. | |
| 2013/0320403 A1 | 12/2013 | Yoder et al. | |
| 2017/0069739 A1 | 3/2017 | Takatani et al. | |
| 2018/0097092 A1 | 4/2018 | Obu et al. | |
| 2021/0257454 A1 | 8/2021 | Adusumilli et al. | |

OTHER PUBLICATIONS

Choi L.J. et al.; A Novel Isolation Scheme featuring Cavities in the Collector for a High-Speed 0.13u SiGe:C BiCMOS Technology; IEEE Topical Meeting on Silicon Monolithic Integrated Circuits in RF Systems; 4 pages (2007).

(Continued)

*Primary Examiner* — Syed I Gheyas

(57) ABSTRACT

A semiconductor device and fabrication method are described for manufacturing a heterojunction bipolar transistor by forming a silicon collector region in a substrate which includes a lower collector layer, a dopant diffusion barrier layer, and an upper collector layer, where the formation of the dopant diffusion barrier layer reduces diffusion of dopants from the lower collector layer into the upper collector layer during one or more subsequent manufacturing steps which are used to form a trench isolation region in the substrate along with a heterogeneous base region and a silicon emitter region.

16 Claims, 13 Drawing Sheets

(56) References Cited

OTHER PUBLICATIONS

Van Noort, Wibo D.; Bipolar Transistors with an Aresnic Spike Epi Layer—Technology and Characterization; Thesis—Delft University of Technology, NL; 134 pages (Oct. 16, 2001).
Schroter, Michael et al.; SiGe HBT Technology: Future Trends and TCAD-Based Roadmap; Proceedings of the IEEE, vol. 105, Issue 6; 19 pages (2017).
Saarnilehto, E. et al.; Local buried oxide technology for HV transistors integrated in CMOS; Proceedings of the 19th Int'l Symp. On Power Semiconductor Devices & ICs, Jeju, Korea; 4 pages (May 27-30, 2007).
Hurwitz, P. et al., Advances in RF Foundry Technology for Wireless and Wireline Communications, 2016 IEEE 16th Topical Meeting on Silicon Monolithic Integrated Circuits in RF Systems (SiRF), (Jan. 2016).

\* cited by examiner

3

4

US 11,990,536 B2

BIPOLAR TRANSISTORS WITH MULTILAYER COLLECTORS

FIELD OF THE INVENTION

The present invention is directed in general to the field of semiconductor devices. In one aspect, the present invention relates to the formation of field effect transistor (FET) devices and heterojunction bipolar transistor (HBT) devices integrated in a bipolar CMOS (BiCMOS) fabrication process flow.

BACKGROUND OF THE INVENTION

As semiconductor device sizes are scaled down, the requirements for device fabrication and design continue to be tightened in order to fit more circuitry on smaller chips by combining different semiconductor technologies into a single integrated circuit. For example, bipolar CMOS (BiCMOS) is a semiconductor technology that integrates bipolar junction transistor (BJT) devices and the CMOS (complementary metal-oxide-semiconductor) field effect transistor (FET) devices in a single integrated circuit device. Technological advances have improved to a point that semiconductor devices are used in advanced communication systems applications, such as mobile telephony, which require High-Frequency (HF) performance. In particular, new radio frequency (RF) applications increasingly require higher carrier frequency capabilities due to the need to realize higher data rates and to the fact that lower frequency bands are becoming more and more congested. The increase in frequency pushes the required cut-off frequency of RF technologies to increasingly higher values.

While bipolar junction transistors have traditionally been used with RF device applications, higher frequency applications are increasingly using heterojunction bipolar transistor (HBT) devices which are made with emitter and base regions having different semiconductor materials, creating a heterojunction. Because of the physical properties of the collector and heterogeneous base and emitter regions, HBT devices can be used to form RF switches that handle very high frequency signals (e.g., up to several hundred GHz), and are increasingly used in modern ultrafast circuits, mostly radio-frequency (RF) systems, and in applications requiring a high power efficiency, such as RF power amplifiers in cellular phones. But as is the case with any leading edge fabrication technology, the specific HBT fabrication processing steps and resulting doping profiles of structural features can adversely impact device performance parameters, such as the open-emitter breakdown voltage $BV_{CBO}$, base-collector capacitance, etc. In order to evaluate the performance of HBT devices, figure of merits (FOMs) in RF applications have been developed, such as the maximum frequencies for current gain $f_T$, power gain $f_{max}$, and voltage gain $f_A$, respectively. In addition, the $R_{on} \times C_{off}$ FOM is used to rate the performance of an RF switch by computing the product of $R_{on}$ (ON resistance) and $C_{off}$ (OFF capacitance), where both metrics should be as low as possible.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
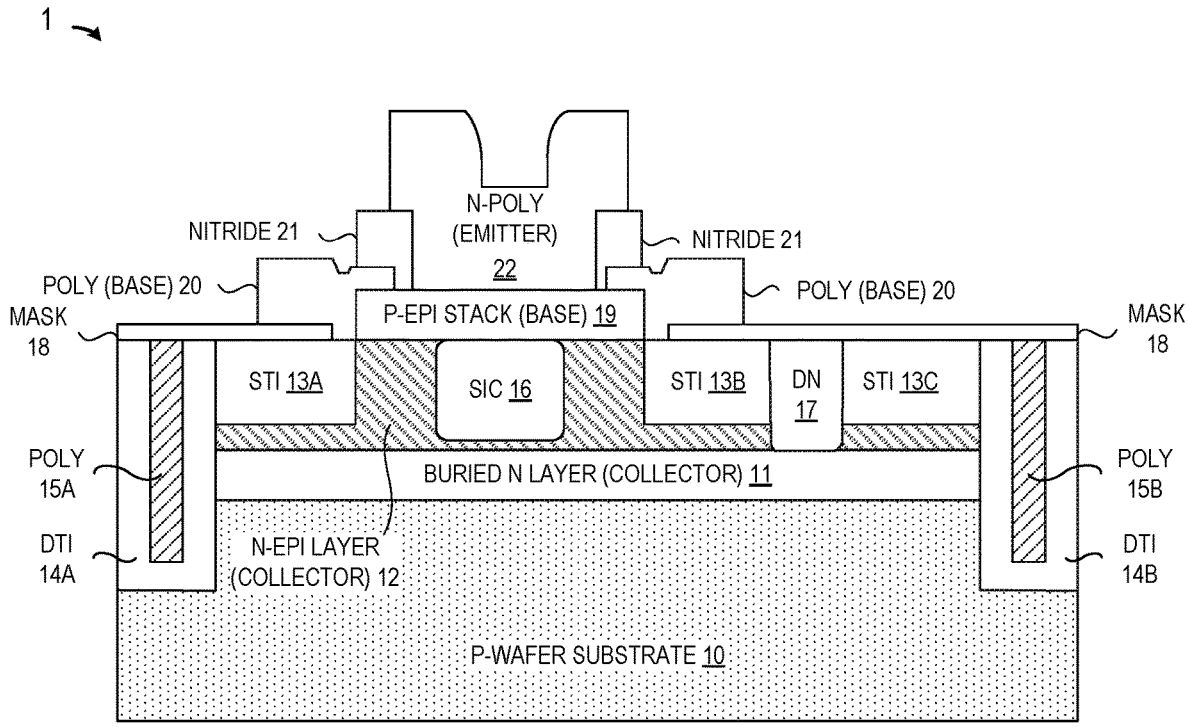
FIG. 1 is a partial cross-sectional view of a semiconductor device with a conventional HBT device formed with an emitter region, a base region and a collector region formed over a substrate.

A semiconductor device and fabrication method are described for fabricating HBT devices in a BiCMOS process flow by forming a barrier layer in the substrate collector region which prevents diffusion of n-type doping concentrations from a buried collector layer and creates very steep NPN doping profiles, thereby enhancing high frequency performance of the HBT devices by forming very low resistance collector regions and achieving open-emitter breakdown voltages $BV_{CBO}$ required for high voltage/high breakdown devices.

In one or more embodiments described herein, the formation of an epitaxial silicon germanium layer as the barrier layer during fabrication of the collector effectively reduces or prevents Arsenic diffusion from the underlying n-type collector layer(s) during one or subsequent process steps. The SiGe layer is formed by a CVD process that uses germane (GeH$_4$) as a precursor. The precursor promotes desorption of Arsenic from the underlying n-type collector layer(s) at a surface that is exposed when forming the SiGe barrier layer on that surface. In one or more other embodiments described herein, the barrier layer is formed in the collector region as an epitaxial silicon oxide layer that effectively reduces or prevents Arsenic diffusion from the underlying n-type collector layer(s) since silicon oxide prevents arsenic diffusion during subsequent thermal processing steps.

While specific implementation details are described herein with reference to one or more example embodiments, the present disclosure is directed to an example processing sequence for fabricating HBT devices in the same BiCMOS process used to form NMOS and/or PMOS switch devices with HBT devices using additional process steps that are minimized to reduce complexity and cost. In selected embodiments, the process steps used for fabricating the HBT devices with barrier layers are standard process steps, so no new fab tools may be needed.

In one or more embodiments, HBT devices with steep NPN doping profiles are fabricated by forming a barrier layer in the collector region at the cost of two additional masks and a dedicated barrier layer (e.g., SiGe) formed between a buried n-type layer and epitaxial collector substrate layer. In one or more embodiments, HBT devices with steep NPN doping profiles are fabricated by forming a sacrificial barrier layer (e.g., SiGe) between a buried n-type collector layer and epitaxial collector substrate layer, and then replacing the sacrificial barrier layer with a replacement oxide layer before forming the base and emitter regions, and then replacing the replacement oxide layer with a polysilicon or metal layer after forming the base and emitter regions. In one or more embodiments, HBT devices with steep NPN doping profiles are fabricated by forming a sacrificial barrier layer (e.g., SiGe) within an epitaxial collector substrate layer, and then replacing the sacrificial barrier layer with a replacement oxide layer before forming the base and emitter regions. By forming a barrier layer as part of the collector fabrication process, up-diffusion of collector dopants from the buried n-type collector layer in subsequent processing steps is limited to create very steep collector doping profiles that enable next generation performance in the 300 GHz-500 GHz range or better. While described with reference to heterogeneous HBT devices formed with silicon collector layer(s), silicon germanium base layer(s), and silicon emitter layer(s), it will be appreciated that these specific example materials are non-limiting examples, and that any suitable semiconductor material may be used to form the collector, base, and emitter layers of the HBT devices in accordance with the present disclosure, Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

To provide additional details for an improved contextual understanding of the present disclosure, reference is now made to FIG. 1 which depicts a partial cross-sectional view of an example semiconductor device 1 with a conventional HBT device which includes an emitter region 22 and base region 19 formed over a substrate collector region 11-12 formed over a wafer substrate 10. In particular, the semiconductor device 1 includes a p-type wafer substrate 10 in which a semiconductor layer structure is provided to form a discrete (in this example) HBT device. As depicted, the discrete HBT device includes an n-type collector region 11-12, a p-type epitaxial stack base region 19-20, and an n-type poly emitter region 22.

As formed, the n-type collector region includes a buried n-layer 11 and an overlying n-type epitaxial collector layer 12 which may be sequentially formed in the p-type wafer substrate 10 using any suitable fabrication steps. For example, the collector region may be formed with a monocrystalline silicon layer that is highly doped with n-type impurities, such as Arsenic, to form the n-type buried layer 11, followed by an epitaxial silicon growth process which is controlled to form an n-type epitaxial silicon 12 over the n-type buried layer 11. After forming the collector regions 11, 12, one or more shallow trench isolation (STI) structures 13A-C and/or deep trench isolation (DTI) structures 14A/B-15A/B may be formed in the in the p-type wafer substrate 10 using any suitable fabrication steps. For example, patterned masks (not shown) may be formed on the substrate to define etching openings where STI and/or DTI trenches are etched and then filled with one or more insulation layers 13, 14, alone or in combination with polysilicon trench layers 15. In addition, the collector region may be implanted with a selectively implanted collector (SIC) region 16 and deep n-well or sinker region 17 using separate mask and implantation steps, where the n-type SIC region 16 is positioned centrally in the active collector region and where the deep n-well or sinker region 17 is positioned to contact the underlying buried n-layer 11 in the collector region. It will be appreciated that although epitaxial growth process may be described as examples, any suitable method of forming the epitaxial layers described may be used.

Formed on the n-type collector region 11-12, the p-type base region includes a p-type epitaxial stack 19 and polysilicon base layer 20 which may be formed on the p-type wafer substrate 10 using any suitable fabrication steps. For example, a patterned mask 18 may be formed on the substrate to define one or more mask openings over the n-type epitaxial collector region 12 where the base region is to be formed. Subsequently, the p-type epitaxial stack 19 is formed, which may, for example, include using an epitaxial formation process to grow or otherwise form a p-type monocrystalline silicon-germanium layer sandwiched between epitaxial silicon layers. In addition, a polysilicon base layer 20 is deposited on the p-type monocrystalline silicon-germanium layer 19 after any required intervening processing steps. After forming the p-type epitaxial stack 19 and polysilicon base layer 20 on the substrate, one or more patterned masks (not shown) may be formed to define etching openings of the poly base layer 20 so that the exposed portions of the polysilicon base layer 20 over the p-type epitaxial base stack 19 and outside of the HBT device area can be selectively etched and removed, as shown.

Formed on the p-type epitaxial base stack 19, the n-type emitter region may be formed with an n-type layer 22 (such as, for example, an n-type polycrystalline silicon layer) that is electrically isolated from the p-epi base stack by means of nitride spacers 21 using any suitable fabrication steps. For example, the nitride spacers 21 may be formed by depositing a nitride layer over the semiconductor device which is then patterned and etched with an etch mask layer (not shown) to selectively remove an exposed (unmasked) portion of the nitride layer 21 which exposes the p-type epitaxial base stack 19. Subsequently, an n-type polysilicon layer 22 may be deposited to fill the mask opening and contact the underlying p-type epitaxial base stack 19. After depositing the n-type polysilicon layer 22, one or more additional etch masks (not shown) may be formed over the n-type polysilicon layer 22 to define etching openings outside of the HBT device area so that the exposed portions of the n-type polysilicon layer 22 and nitride layer 21 can be selectively etched and removed, as shown. Though not shown, it will be appreciated that additional contact layers, such as self-aligned silicide layers, may be formed to provide electrical connection to the collector, base, and emitter regions.

In the depicted semiconductor device 1, the doping concentration level and profile of the n-type buried layer 11 may be controlled by the implantation energies and concentrations used to implant the n-type impurities, such as Arsenic, into the substrate. Ideally, the doping profile of the implanted n-type impurities is controlled to have a high doping concentration in collector region to provide low series resistance with a sharp drop in doping concentration towards the base to provide low base-collector capacitance. Unfortunately, there are additional heating or annealing processes involved in one or more of the subsequent processing steps used to form other device features, such as the n-epi collector layer 12, STI structures 13, DTI structures 14-15, SIC 16, deep n-well or sinker region 17, etc. These additional heating/ annealing steps cause the implanted collector impurities to diffuse from the buried p-layer 11 and into the upper collector regions near the base region 19, and the resulting dopant profile can limit the RF performance of the HBT device. This undesired dopant diffusion from buried collector layers into upper collector layers and toward the base is referred to as "updiffusion."

Unfortunately, existing BiCMOS process technologies are not well suited at a practical level for fabricating HBT devices by virtue of the challenges with fabricating leading edge HBT devices that meet the performance requirements of HF applications. Further limitations and disadvantages of conventional processes and technologies will become apparent to one of skill in the art after reviewing the remainder of the present application with reference to the drawings and detailed description which follow.

Figure 2:
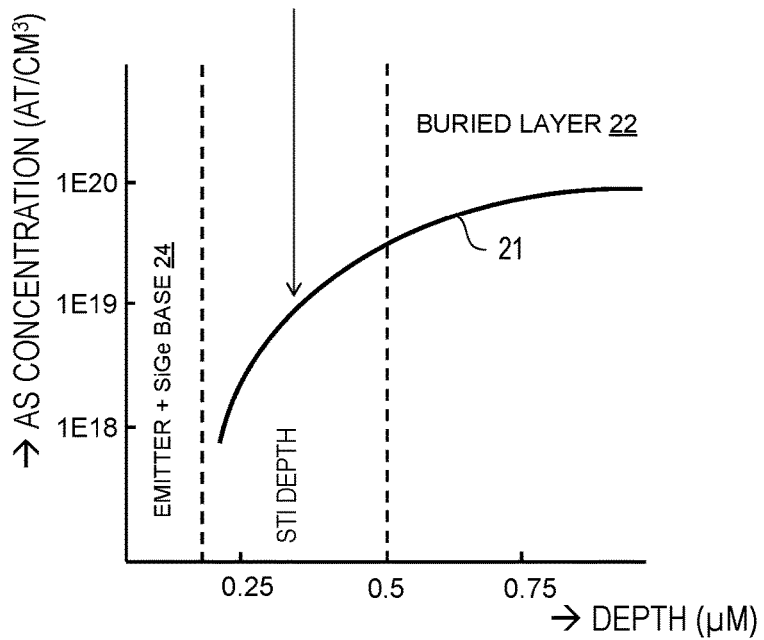
FIG. 2 is a schematic doping profile of a buried collector layer that is highly doped with Arsenic to illustrate the diffusion of Arsenic towards the silicon germanium base.

To illustrate an example of undesired updiffusion, reference is now made to FIG. 2 which depicts a schematic doping profile 2 after completing the fabrication of a conventional HBT device. As depicted, the collector-implanted arsenic concentration profile 21 has a high doping concentration at the deeper device regions (e.g., 0.75 μm) where the arsenic is implanted in the n-type buried collector layer 22. However, the arsenic concentration profile 21 has a lower, but significant doping concentration at shallower device regions (e.g., at the depth of the STI structures). This buried layer updiffusion area 23 is caused by anneal effects from the processing steps that occur after implanting the Arsenic into the n-type buried collector layer 22. In particular, the anneal effects drive (or "updiffuse") the implanted Arsenic from the n-type buried collector layer toward the emitter and base regions 24.

The strong updiffusion of Arsenic from the n-type buried collector layer 22 directly determines the thickness of the n-type epitaxial collector layer (e.g., n-epi layer 12 in FIG. 1) that is needed to achieve a required base-collector breakdown voltage spec $BV_{CBO}$ for a high voltage/high breakdown devices. At the same time, the n-type epitaxial collector layer may require a selectively implanted collector region that has a higher concentration of implants, such as Phosphorus or Arsenic, to overcome the Kirk effect and create an optimized doping profile for a low voltage/high speed device. In addition to the foregoing, the Arsenic updiffusion towards the emitter/base region 24 can introduce undesired additional base-collector capacitance in the HV device by effectively moving the n-type buried collector layer closer to the bottom of the STI structures, where enhanced diffusion of Arsenic along the edges of the STI structures is believed to contribute negatively to increased ICBO/ACEO yield loss.

To address these deficiencies and others known to those skilled in the art with the designs and fabrication methods of conventional HBT devices, there is disclosed herein a method and apparatus for incorporating a barrier layer into the collector fabrication process to reduce the buried layer updiffusion in finally formed HBT devices, thereby achieving vertical doping profiles for collector regions that drive performance from $f_T/f_{MAX}$=300 GHz towards 500 GHz. In selected embodiments, the barrier layer is formed as a dedicated sacrificial SiGe layer that is incorporated into the fabrication of both HBT devices and in other devices, such as an NMOS switch to improve both HBT and NMOS switch performance. In such embodiments, formation of the sacrificial SiGe layer by chemical vapor deposition process which uses germane ($GeH_4$) as a precursor promotes Arsenic desorption from the surface underlying the SiGe layer. In selected embodiments, formation of a SiGe barrier layer in the substrate of an NMOS FET switch device can be used to improve the Ron×Coff FOM of a NMOS RF switch while simultaneously decreasing Arsenic updiffusion from the buried n-type collector layer in an HBT device to achieve very low collector resistance and to achieve very steep collector doping profiles to enable next generation RF device performance with 500 GHz switching speeds.

Various illustrative embodiments of the present invention will now be described in detail with reference to FIGS. 1-24. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art how to make or use the present invention.

Figure 3:
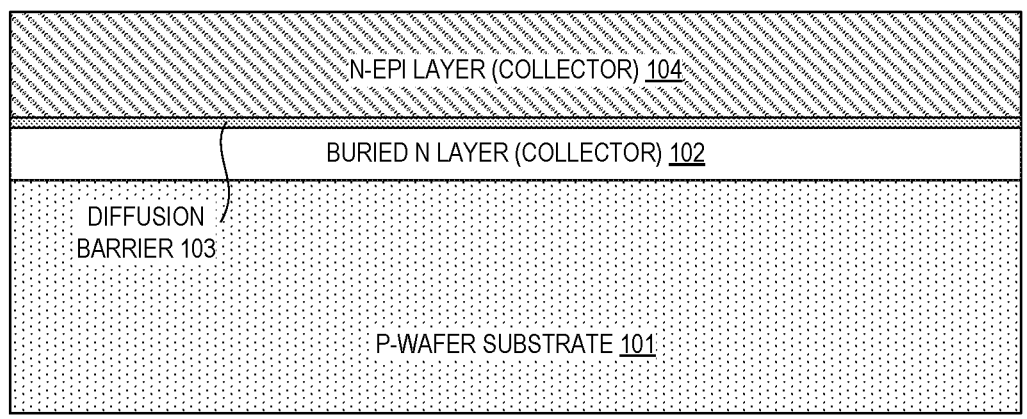
FIGS. 3-6 illustrate cross sectional views of a first sequence of steps for fabricating HBT devices with a diffusion barrier layer formed in the collector region in accordance with selected embodiments the present disclosure.

Turning now to FIG. 3, a partial cross-sectional view illustrates a semiconductor structure 3 including a buried n-type collector layer 102 and an n-type epitaxial collector layer 104 formed over a p-type wafer substrate layer 101 and separated from one another by a barrier diffusion layer 103. As will be appreciated, the p-type wafer substrate layer 101 may be implemented as a bulk silicon substrate, monocrystalline silicon (doped or undoped), or any semiconductor material including, as non-limiting examples, Si, SiC, SiGe, SiGeC, Ge, GaAs, InAs, InP as well as other Group III-V compound semiconductors or any combination thereof, and may be formed as the bulk handling wafer. In addition, any suitable sequence of processing steps may be used to form the buried n-layer 102. For example, the p-wafer substrate 101 may be implanted with a high dose implant of n-type impurities, such as Arsenic, to a predetermined depth and doping concentration by controlling the implantation energies and concentrations used to implant the n-type impurities into the substrate 101. After implantation, an oxidation heating step may be applied to anneal the implanted impurities into the monocrystalline structure of the p-wafer substrate layer 101, thereby forming the buried n-type collector layer 102.

On the buried n-type collector layer 102, a thin barrier layer 103 and n-type epitaxial collector layer 104 are sequentially formed using any suitable sequence of processing steps. For example, the thin barrier layer 103 may be formed by using a controlled process to grow or otherwise form an epitaxial layer of silicon germanium (SiGe) to a predetermined thickness, such as by depositing a SiGe layer with a chemical vapor deposition process which uses $GeH_4$ and $SiH_4$ or $SiH_2Cl_2$ as sources at a reduced pressure (e.g., 5-20 Torr) and specified temperature (e.g., 500 to 700°) for sufficient time to form the desired thickness of the SiGe layer (e.g., 20 nm). As will be appreciated, other precursor gases, pressure, temperature, time, and thickness values may be used. As disclosed herein, the diffusion blocking function of the SiGe barrier layer 103 effectively results from exposing the surface to germane ($GeH_4$) during the chemical vapor deposition (CVD) process which promotes desorption of Arsenic from the underlying n-type epitaxial collector layer 104. In effect, the Arsenic desorption that occurs during formation of the epitaxial SiGe barrier layer 103 removes Arsenic from the n-type buried collector layer 102 via desorption at the surface of that layer, resulting in more vertical doping profiles for the collector regions than would be obtainable otherwise.

In selected embodiments, the SiGe barrier layer 103 contains an atomic percentage of 10-25% germanium and has a thickness between 5-100 nm (e.g., 20 nm), though any suitable materials and thicknesses may be used, provided that the material properties of the barrier layer 103 include the ability to prevent or reduce impurity updiffusion from the n-type collector layer 102 into the upper n-type epitaxial collector layer 104 during subsequent fabrication processing steps.

In selected embodiments, the thin barrier layer 103 may be selectively formed in specified areas instead of covering the entirety of the buried n-type collector layer 102. In such embodiments, a patterned oxide mask may be formed on the buried n-type collector layer 102 prior to performing the epitaxial growth process, where the patterned oxide mask includes openings exposing the underlaying buried n-type collector layer 102 where the thin barrier layer(s) 103 are to be formed. For example, a masking layer (not shown) may be formed on the buried n-type collector layer 102 by depositing an oxide and/or other and/or other suitable dielectric layer using chemical vapor deposition (CVD), plasma-enhanced chemical vapor deposition (PECVD), physical vapor deposition (PVD), atomic layer deposition (ALD), thermal oxidation, or any combination(s) of the above to a predetermined thickness. By patterning and etching the masking layer to define the specified area with an opening in the masking layer, the epitaxial growth process will form the epitaxial barrier layer 103 only in the opening of the masking layer. In such embodiments, the patterned masking layer is removed after forming the barrier layer 103, leaving the epitaxial barrier layer 103 and exposed underlying buried n-type collector layer 102.

Subsequently, the n-type epitaxial collector layer 104 may be formed on the barrier layer 103 by using a controlled epitaxial growth process to grow an n-doped epitaxial layer of silicon to a predetermined thickness. As will be appreciated, any suitable methods for epitaxy may be used to form the n-doped epitaxial layer of silicon and other epitaxial layers in embodiments herein. In selected embodiments, the resulting n-type epitaxial collector layer 104 has a thickness of around 300 nm, though any suitable materials and thicknesses may be used.

The terms "epitaxial growth, "epitaxial deposition" and "epitaxial formation" all refer generally to a semiconductor process for forming, depositing, or growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. For example, epitaxial semiconductor layers, such as epitaxial silicon, are often grown using vapor-phase epitaxy (VPE), a modification of chemical vapor deposition. Molecular-beam and liquid-phase epitaxy (MBE and LPE) are also used, mainly for compound semiconductors. Solid-phase epitaxy is used primarily for crystal-damage healing or for crystallizing a deposited film of amorphous material on a crystalline substrate. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. Furthermore, it will be appreciated that, although processes herein may be described as epitaxial growth processes, other suitable methods of forming epitaxial layers may be employed.

Figure 4:
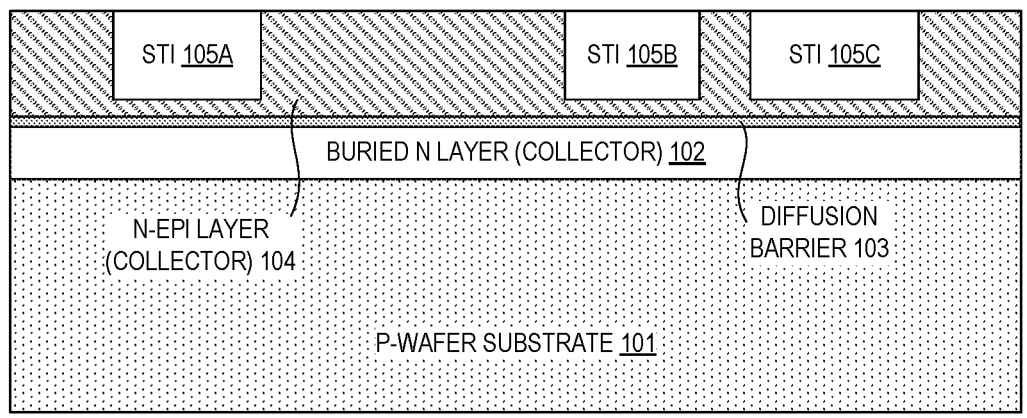
Figure 6:
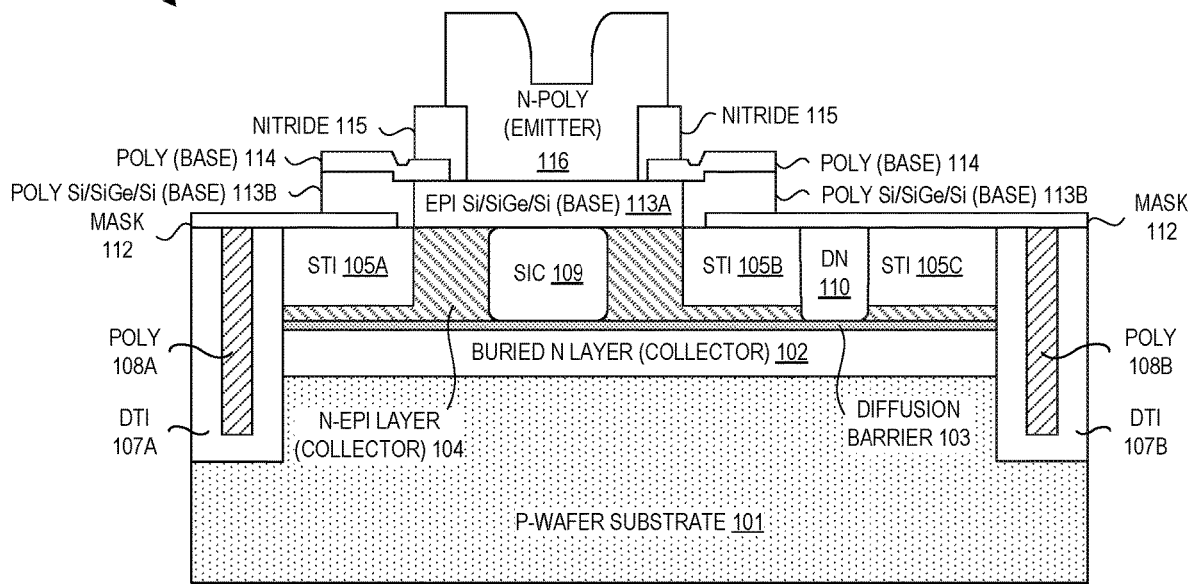

FIG. 4 illustrates processing of the semiconductor structure 4 subsequent to FIG. 3 after shallow trench isolation (STI) structures 105A-C are formed in the n-epi collector layer 104 using any suitable sequence of processing steps. For example, a patterned masking layer of oxide and/or nitride (not shown) may be formed on the n-epi collector layer 104 to define mask openings where shallow trenches are etched into the n-epi collector layer 104 to a predetermined depth. Subsequently, the shallow trenches are filled with one or more insulation layers (e.g., by depositing high density plasma oxide) and optionally polished or etched to form the STI structures 105A-C. As formed, the STI structures 105A-C extend only partway through the thickness of the n-epi collector layer 104 without reaching the barrier layer 103. Such a step is relatively standard and accordingly will not be described further. In addition, the relative lateral positioning of the STI structures 105A-C is controlled to provide insulation protection of the finally formed HBT device, such as by surrounding the HBT device with the STI structures 105A-B, as indicated in FIG. 6. As will be appreciated, any thermal processing used in the formation of the STI structures 105A-C will not result in significant updiffusion of the n-type impurities from the buried n-layer 102 since the barrier layer 103 is positioned to prevent or reduce dopant migration into the n-epi collector layer 104. As disclosed herein, the HBT device will benefit if the updiffusion is reduced by the barrier layer 103, and the updiffusion does not need to be fully blocked.

Figure 5:
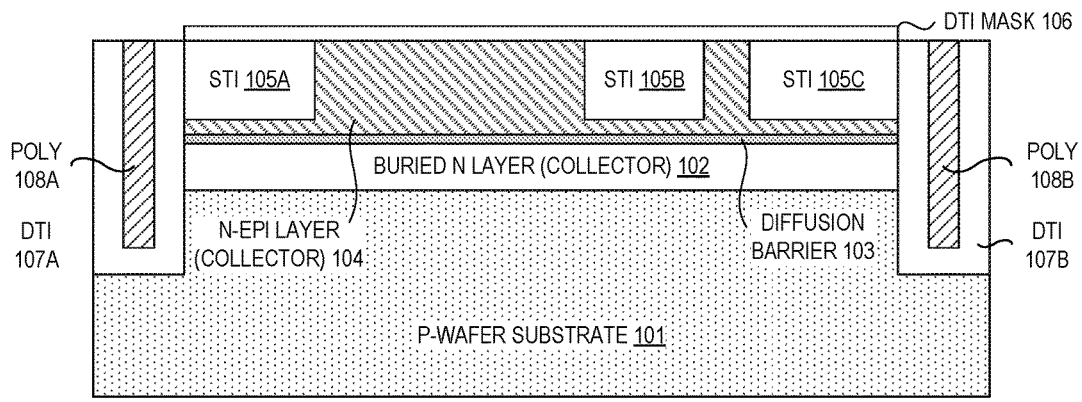

FIG. 5 illustrates processing of the semiconductor structure 5 subsequent to FIG. 4 after deep trench isolation (DTI) structures 107A/B-108A/B are formed in the n-epi collector layer 104 using any suitable sequence of processing steps. For example, a patterned DTI masking layer 106 may be formed on the n-epi collector layer 104 to define mask openings where deep trenches are to be etched. As formed, the deep trenches are positioned in the semiconductor structure 5 to surround and isolate the HBT device. In selected embodiments, the DTI masking layer 106 may be formed with a patterned layer of oxide and/or nitride which is used to etch deep trench openings through the underlying n-epi collector layer 104, barrier layer 103, and buried n-type collector layer 102, and into the p-wafer substrate layer 101. In particular, one or more anisotropic etch processes may be applied to the patterned DTI masking layer 106 to reach the underlying p-wafer substrate layer 101. Once the deep trench openings are formed, they are typically lined with one or more insulator layers 107A/B, such as by forming or growing a thin seed oxide layer and then conformally depositing a high-density plasma oxide. In addition, the centers of the deep trench openings may be filled with a polysilicon layer 108A/B. Subsequently, once the deep trenches are filled with insulation and/or polysilicon layers 107A/B-108A/B, an optional polish or etch process may be applied to planarize the DTI structures 107A/B-108A/B. As will be appreciated, any thermal processing used in the formation of the DTI structures 107A/B-108A/B will not result in significant updiffusion of the n-type impurities from the buried n-layer 102 since the barrier layer 103 is positioned to prevent or reduce dopant migration into the n-epi collector layer 104. Again, the HBT device will benefit if the updiffusion is reduced by the barrier layer 103, and the updiffusion does not need to be fully blocked.

FIG. 6 illustrates processing of the semiconductor structure 6 subsequent to FIG. 5 after forming the selectively implanted collector (SIC) region 109, deep n-well or sinker region 110, base regions 113, 114, and emitter regions 116. For example, the SIC region 109 may be formed by using a first implant mask to selectively diffuse or implant n-type impurities into the underlying n-epi collector layer 104 to be positioned centrally in the active collector region. In similar fashion, the n-type sinker well or body regions 110 may be formed by using a second implant mask to selectively diffuse or implant n-type impurities (e.g., Phosphorous) into the underlying n-epi collector layer 104 so as to contact the underlying buried n-layer 102 through the barrier layer 103 at a location outside of the active collector region.

After forming the DTI structures 107-108, the base and emitter regions of the HBT device are selectively formed over and in contact with the active collector region using any suitable deposition, pattern, mask, etch, and/or implantation steps. For example, a p-type base region may be formed on the collector region with a SiGe base stack 113 and poly base layer 114 using any suitable fabrication steps. In selected embodiments, the p-type base region is formed by forming a patterned mask 112 on the semiconductor structure to define one or more mask openings over the n-type epitaxial collector region 104 where the base region is to be formed. For example, the patterned mask 112 may be formed as a seed layer which includes a thin stack of tetraethyl orthosilicate (TEOS), silicon nitride, and polysilicon that has a mask opening over the collector region where the SiGe base stack 113 will be formed. Subsequently, the SiGe base stack 113 is formed in the mask opening to include a monocrystalline epitaxial stack portion 113A above the collector region and a polycrystalline stack portion 113B above the shallow trench isolation regions 105A, 105B. In selected embodiments, a non-selective deposition process is used to form the SiGe base stack 113 by growing a monocrystalline epitaxial stack of Si/SiGe:C/Si layers 113A on the unmasked portion of the n-type epitaxial collector region 104 while simultaneously forming a polycrystalline stack portion 113B with, for example, a stack of polycrystalline Si/SiGe:C/Si layers, on the patterned mask 112 and STI structures 105A, 105B. In both the epi and poly base stacks 113A, 113B, the sandwiched SiGe layer is doped with p-type dopants (e.g., boron) to form a p-type spike which is sandwiched between silicon layers as part of the p-type base region. In an example embodiment, the non-selective deposition process for forming the epi and poly base stacks 113A, 113B is controlled to form the p-type epitaxial Si/SiGe:C/Si base stack 113A with a SiGe:C layer having an atomic percentage of 10-35% germanium and a p-type doping concentration in the range of $1 \times 10^{19}$-$1 \times 10^{21}$ cm$^{-3}$. In addition, the epitaxial stack portion 113A may include stacked or sandwiched epi-Si layers positioned above and below the epitaxial SiGe:C layer which have lower p-type doping concentrations (e.g., in the range of $1 \times 10^{17}$-$1 \times 10^{19}$ cm$^{-3}$).

On the SiGe base stack 113A/B, a poly base layer 114 is formed to connect the p-type epitaxial SiGe layer to an extrinsic base contact using any suitable sequence of processing steps. For example, a p-doped polysilicon base layer 114 may be conformally deposited over the SiGe base stack 113A/B with in-situ p-type doping (e.g., Boron) so that a heat step drives the p-type doping from the polysilicon base layer 114 into the monocrystalline SiGe layer of the epitaxial stack portion 113A.

After forming the p-type SiGe base stack 113A/B and poly base layer 114, one or more patterned masks (not shown) may be formed to define etching openings outside of the HBT device area so that exposed portions of the p-type SiGe base stack 113A/B and poly base layer 114 can be selected etched or removed by applying one or more anisotropic etch processes. For example, a first patterned mask (not shown) may be formed to define etch openings outside of the HBT device area so that the exposed portions of the base layers 113, 114 can be selectively etched and removed, thereby leaving the unetched portions of the base layers 113, 114 over the HBT device area. In such embodiments, the selective etch process can include using a patterned photoresist mask to perform a sequence of reactive-ion etching (RIE) steps having suitable etch chemistry properties to remove, in sequence, the exposed portions of the silicon and silicon germanium layers in the underlying poly base layer 114 and poly base stack 113B. In addition, a second patterned mask (not shown) may be formed to define an etch opening over an active collector region of the HBT device so that the exposed portions of the poly base layer 114 can be selectively etched and removed, thereby leaving the unetched portions of the p-type SiGe base stack 113A over the active collector region of the HBT device. In such embodiments, the selective etch process can include using a patterned photoresist mask to perform a sequence of reactive-ion etching (RIE) steps having suitable etch chemistry properties to remove, in sequence, the exposed portions of the underlying poly base layer 114 while leaving in place the p-type SiGe base stack 113A over the active collector region of the HBT device.

After forming the patterned p-type SiGe base stack 113A/B and poly base layer 114, an n-type emitter may be formed with a patterned n-type silicon region 116 that is electrically isolated from the p-type base layers 113, 114 by means of nitride spacers 115 using any suitable fabrication steps. For example, the nitride spacers 115 may be formed by depositing a nitride layer over the semiconductor structure which is then patterned and etched with an etch mask layer (not shown) to selectively remove an exposed (unmasked) portion of the nitride layer 115 and form a nitride layer opening which exposes a portion of the epitaxial p-type SiGe base stack 113A over the active collector region of the HBT device. Subsequently, an n-type emitter region 116 may be deposited to fill the nitride layer opening and contact the underlying p-type epitaxial base stack 113A. In selected embodiments, a non-selective deposition process is used to form the n-type emitter region 116 by simultaneously growing an n-type epitaxial silicon emitter layer on the unmasked portion of the underlying p-type epitaxial base stack 113A while simultaneously growing an n-type polycrystalline silicon emitter layer on the unetched nitride layer 115. As disclosed, the n-type emitter region 116 may be in-situ doped during the deposition process, such as by doping the epitaxial silicon emitter layer and polycrystalline silicon emitter layer with n-type dopants (e.g., arsenic and/or phosphorus) to form the n-type emitter region. After depositing/growing the n-type epitaxial/polys silicon emitter region(s) 116, one or more additional etch masks (not shown) may be formed over to define etching openings outside of the HBT device area so that exposed portions of the n-type epitaxial/polys silicon emitter region(s) 116 can be selectively etched and removed, thereby leaving the patterned n-type emitter region 116 over the active collector region of the HBT device, as shown. Though not shown, it will be appreciated that additional contact layers, such as patterned silicide layers, may be formed to provide electrical connection to the collector, base, and emitter regions.

As disclosed herein, one or more heat treatments may be applied to form the final p-type base region 113A/B and n-type emitter region 116. However, any thermal processing used in the formation of the base and emitter regions will not result in significant updiffusion of the n-type impurities from the buried n-layer 102 since the barrier layer 103 is positioned to prevent or reduce dopant migration into the n-epi collector layer 104. Again, the HBT device will benefit if the updiffusion is reduced by the barrier layer 103, and the updiffusion does not need to be fully blocked.

As shown in FIG. 6, the barrier layer 103 is introduced in the collector fabrication sequence to limit buried n-type (BN) layer updiffusion. In selected embodiments, the barrier layer 103 is formed by epitaxially growing a thin SiGe layer on top of the buried n-type (BN) collector layer before forming the n-type epitaxial collector layer 104. In addition, the epi-SiGe barrier layer 103 is left in place underneath the HBT device. In this way, the epi-SiGe barrier layer 103 may suppress Arsenic updiffusion in the HBT device. In addition, the epi-SiGe barrier layer 103 may serve as a sacrificial layer for devices, such as a RF NMOS switch, since its differentiated material properties (e.g., SiGe) enable the layer to be selectively removed and replaced with another material layer, such as oxide.

Figure 7:
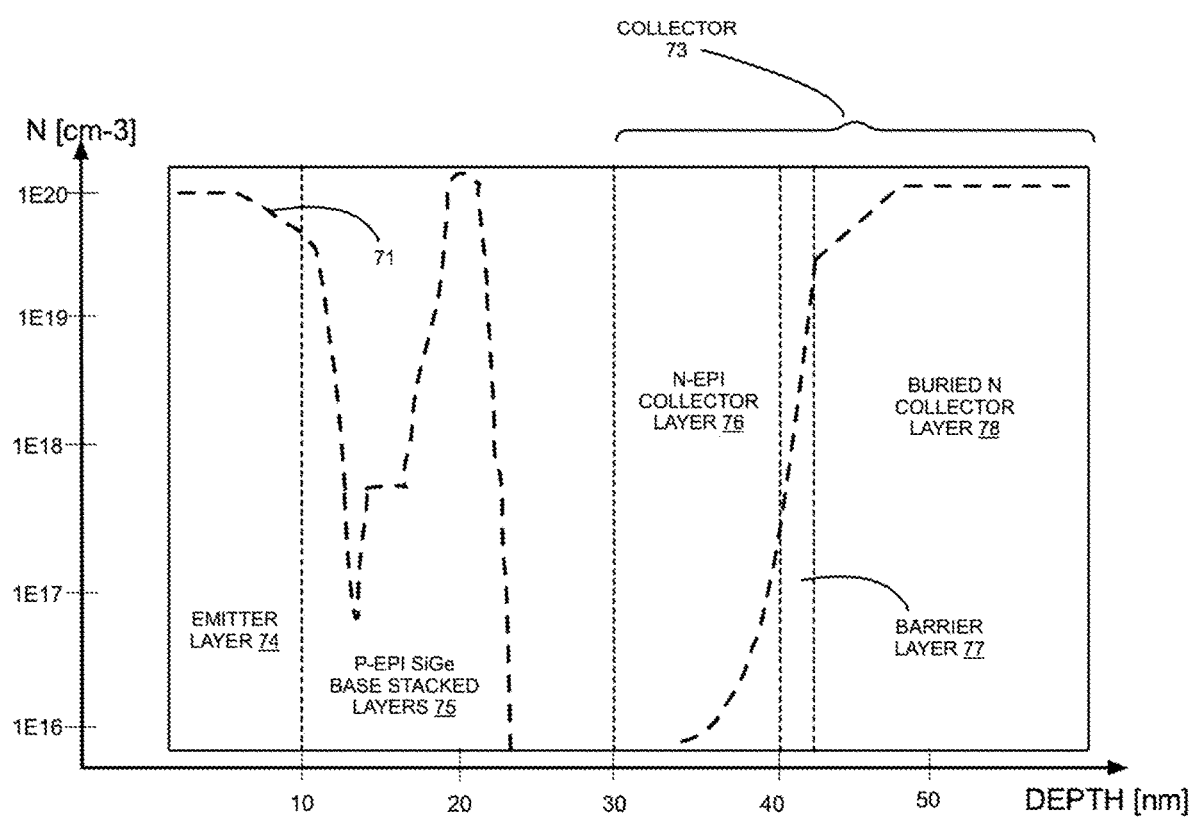
FIG. 7 illustrates a schematic doping profile of a HTB device formed in accordance with selected embodiments of the present disclosure.
Figure 8:
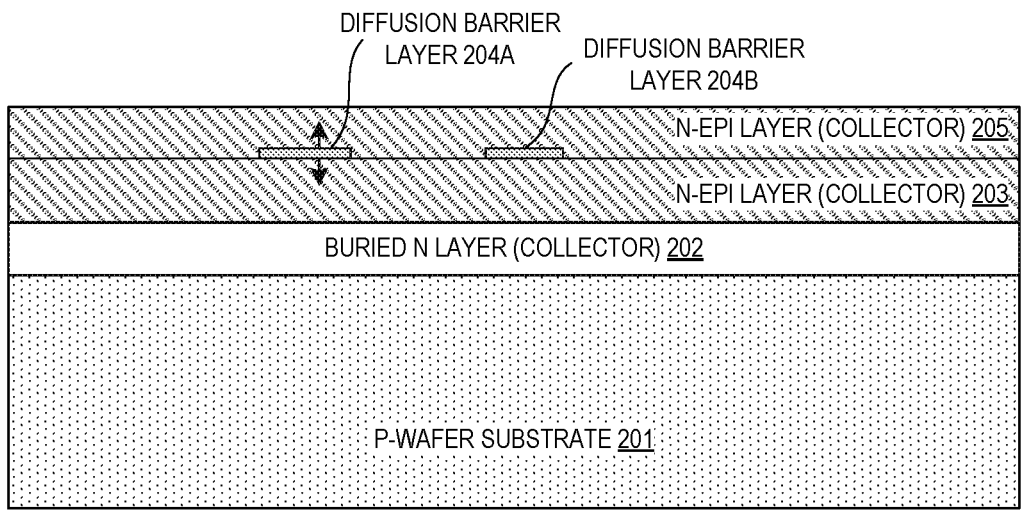
FIGS. 8-13 illustrate cross sectional views of a second sequence of steps for fabricating HBT devices wherein a sacrificial diffusion barrier layer in the collector region is replaced with a replacement oxide layer before forming the base and emitter regions in accordance with selected embodiments of the present disclosure.

To illustrate how the barrier layer enables a more ideal collector doping profile by at least reducing the amount of collector updiffusion, reference is now made to FIG. 7 which illustrates a schematic 1-D doping profile 7 of a HTB device which includes HBT region labels 74-78 along the x-axis formed in accordance with selected embodiments of the present disclosure. As depicted, the dopant profile 71 (abs $(N_A-N_D)$) indicates there is a high concentration of n-type impurities in the n-poly emitter layer 74 before dropping to a lower concentration at the emitter/base junction. In addition, the dopant profile 71 indicates there is a high concentration of p-type impurities in the middle SiGe layer of the p-epi SiGe base stacked layers 75, with lower impurity concentrations in the surrounding silicon layers of the p-epi SiGe base stacked layers 75. The dopant profile 71 also indicates that the n-epi collector layer 76 has a low concentration of n-type impurities down to the depth of the barrier layer 77 before the concentration of n-type impurities increases to a high concentration in the buried n-type collector layer 78. In this example, there is no germanium in the n-poly emitter layer 74, and then the germanium concentration increases across the p-epi SiGe base stacked layers 75 before returning to zero at the base/collector junction.

As seen from the dopant profile 71 in the collector region 73, the barrier layer 77 prevents the high concentration of n-type impurities in the buried n-type collector layer 78 from diffusing up into the n-epi collector layer 76 in the finally formed HBT device. As a result, the buried n-type collector layer 78 has a peak n-type doping concentration of $1\times10^{20}$ $cm^{-3}$, and the n-type doping concentration of is reduced to $1\times10^{16}$ $cm^{-3}$ within 10-20 nm by virtue of the function and positioning of the barrier layer 77.

As disclosed herein, the SiGe barrier layer may be formed from a SiGe formation process that is used in other devices of the integrated circuit, such as the sacrificial SiGe layer that is part of the local buried oxide process used with high power and/or high voltage devices.

Alternatively, the SiGe barrier layer may be grown independently from the sacrificial layer for other devices. This would add a degree of freedom in achieving the optimum depth of the SiGe layer for the HBT device and the other devices of the integrated circuit. In addition, or in the alternative, the SiGe barrier layer may be selectively formed and replaced with an alternative barrier layer, such as silicon oxide, to provide a localized diffusion barrier function to improve HBT device performance.

To provide additional details for an improved understanding of selected embodiments of the present disclosure, reference is now made to FIGS. 8-13 which depict cross sectional views of a second sequence of steps for fabricating HBT devices wherein selectively formed sacrificial barrier layers in the collector region are replaced with a replacement oxide layer.

The starting point (see FIG. 8) is semiconductor structure 8 having a p-type silicon wafer substrate 201 on which is formed a buried n-type collector layer 202 using any suitable fabrication steps, such as those described above with reference to layers 101, 102 in FIG. 3. On the buried n-type collector layer 202, a first or lower n-type epitaxial collector layer 203 is deposited or grown on the buried n-type collector layer 202 by epitaxy to a predetermined depth. In addition, the barrier layers 204A, 204B are selectively formed on the first or lower n-type epitaxial collector layer 203 to a predetermined thickness. For example, the barrier layers 204A, 204B may be formed by using a controlled process to grow or otherwise form an epitaxial layer of silicon germanium (SiGe) to a predetermined thickness, such as by depositing a SiGe layer with a chemical vapor deposition process which uses $GeH_4$ and $SiH_4$ or $SiH_2Cl_2$ as sources at a reduced pressure (e.g., 5-20 Torr) and specified temperature (e.g., 500 to 700°) for sufficient time to form the desired thickness of the SiGe layer (e.g., 20 nm). As will be appreciated, other precursor gases, pressure, temperature, time, and thickness values may be used. As disclosed herein, the diffusion blocking function of the SiGe barrier layers 204A, 204B effectively results from the chemical vapor deposition (CVD) process used to form the SiGe barrier layers 204A, 204B which exposes the surface of the first or lower n-type epitaxial collector layer 203 to germane (GeH$_4$), thereby promoting desorption of Arsenic from the first or lower n-type epitaxial collector layer 203 at a surface of that layer.

In selected embodiments, the barrier layers 204A, 204B may be selectively formed as patterned sacrificial SiGe barrier layers in specified areas of the first n-type epitaxial collector layer 203 by first forming a patterned oxide mask (not shown) on the first n-type epitaxial collector layer 203 before performing an epitaxial SiGe growth process. As formed, the patterned oxide mask may include openings exposing the underlaying n-type epitaxial collector layer 203 where the patterned sacrificial patterned sacrificial SiGe barrier layers 204A, 204B are to be formed. By performing the SiGe epitaxial growth process with the patterned oxide mask in place, the patterned sacrificial SiGe barrier layers 204A, 204B may be formed with an atomic percentage of 10-25% germanium between and a thickness between 5-100 nm (e.g., 20 nm), though any suitable materials and thicknesses may be used, provided that the material properties of the barrier layers 204A, 204B include the ability to prevent or reduce impurity updiffusion from the first n-type epitaxial collector layer 203 into the second n-type epitaxial collector layer 205 during subsequent fabrication processing steps.

After removing the patterned oxide mask to leave the patterned sacrificial SiGe barrier layers 204A, 204B and exposed underlying n-type epitaxial collector layer 203, a second or upper n-type epitaxial collector layer 205 is deposited or grown by epitaxy to a predetermined depth. As indicated by the "up" and "down" arrows, the depth or position of the barrier layers 204A, 204B can be moved to a shallower or deeper position in the semiconductor structure substrate, depending upon the relative thicknesses of the first and second n-type epitaxial collector layers 203, 205.

As described herein below, the depth of the barrier layers 204A, 204B may be controlled to provide a performance benefit for the finally formed HBT devices, such as reducing ICBO/ACEO yield loss (when positioned lower in the n-epi collector layer) or increasing switching speed by reducing base-collector capacitance (when positioned higher in the n-epi collector layer). In addition, the depicted barrier layers 204A, 204B are positioned as separate layers that are located at the periphery of the active collector region and adjacent to the shallow trench isolation regions of the finally-formed HBT device. In other embodiments, a single continuous barrier layer may be formed to extend across the active collector region and between the shallow trench isolation regions of the finally-formed HBT device.

Figure 9:
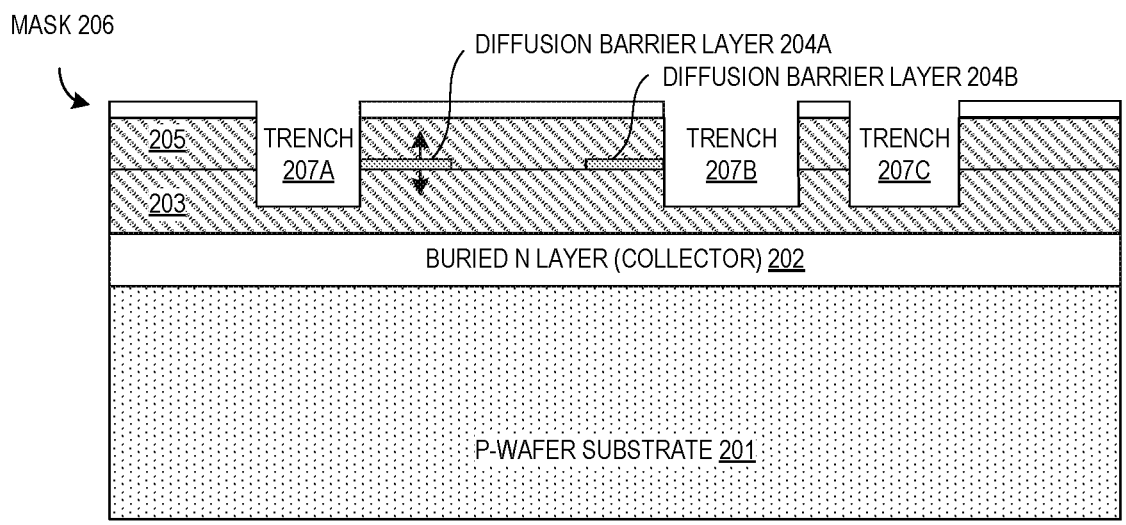

Subsequently and as shown in FIG. 9, trenches 207A-C are formed in the semiconductor structure 9 using any suitable sequence of processing steps. For example, a patterned masking layer of oxide and/or nitride 206 may be formed on the second or upper n-type epitaxial collector layer 205 to define mask openings where shallow trenches 207A-C are etched into the second or upper n-type epitaxial collector layer 205 to a predetermined depth. With the patterned mask 206 in place, a selective etch process is applied to form the trenches 207A-C, such as by performing one or more reactive-ion etching (RIE) steps having suitable etch chemistry properties to remove at least the upper n-type epitaxial collector layer 205. As depicted, the relative lateral positioning of the openings in the mask 206 are controlled so that the etched trenches 207A-C align with and access the barrier layers 204A, 204B on at least one side. In addition, the etched trenches 207A-C extend only partway down to the buried the n-type collector layer 202 but far enough to reach the barrier layers 204A, 204B.

Figure 10:
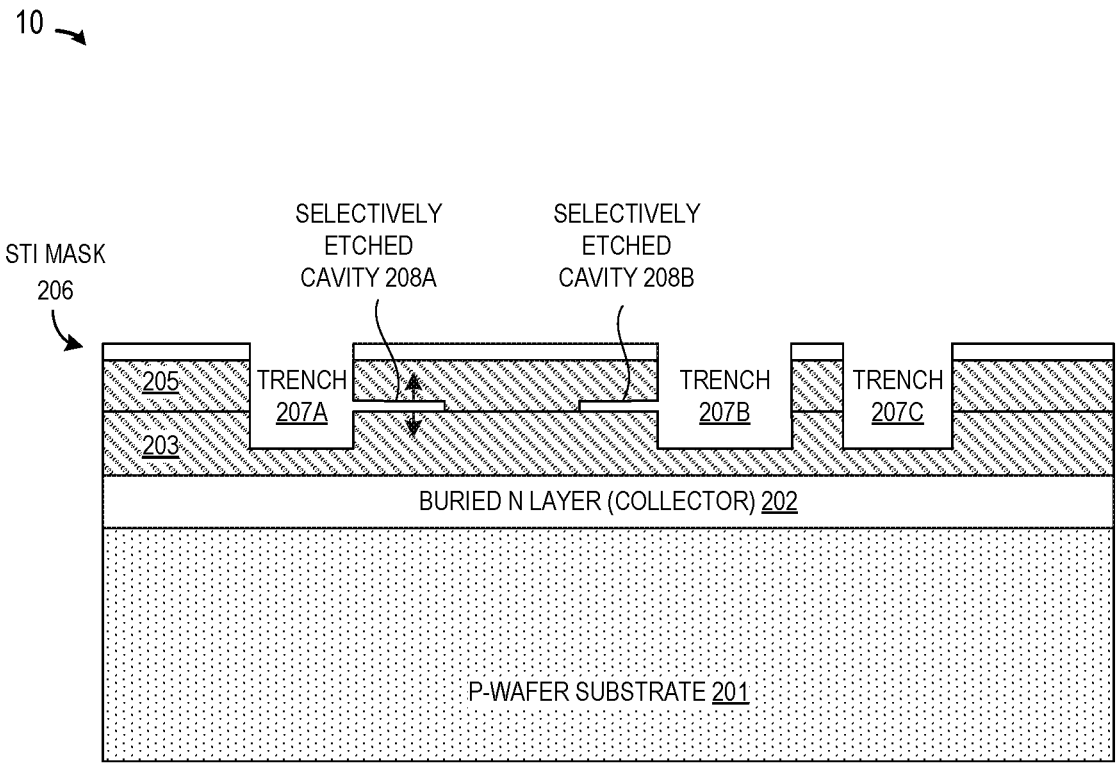

Subsequently and as shown in FIG. 10, a selective etch is applied to the semiconductor structure 10 to etch away the barrier layers 204A, 204B which are adjacent to and exposed by the trenches 207A-C, leaving the selectively etched cavities 208A, 208B. In selected embodiments, the selective etching of SiGe may be implemented by using any suitable anisotropic epitaxial silicon etch process, such as a selective dry etching step with atomic fluorine or an isotropic reactive ion etch (RIE) which selectively removes the barrier layers 204A, 204B without etching the n-type epitaxial collector layers 203, 205.

Figure 11:
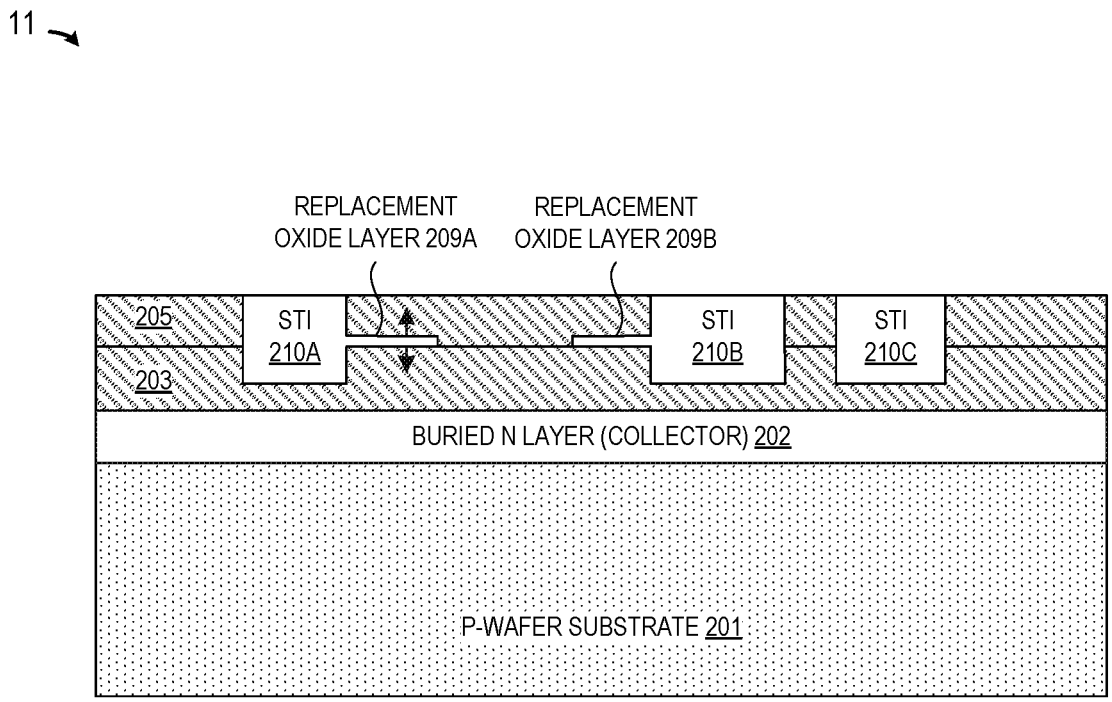

Subsequently, and as shown in FIG. 11, an oxidation process is applied to the semiconductor structure 11 to fill the cavities 208A, 208B by forming one or more oxide layers to form replacement oxide layers 209A, 209B and to fill the trenches 207A-C with a shallow trench isolation oxide layers 210A-C. For example, a first oxide liner layer may be formed on the surfaces of the trenches 207A-C and cavities 208A, 208B as a conformal dielectric layer formed with a first dielectric material (e.g., hafnium oxide) using an oxide formation process which fills the cavities 208A, 208B without completely filling the trenches 207A-C. In selected embodiments, the oxide formation process may be an atomic layer deposition (ALD) oxide deposition process or other suitable oxide deposition process, such as a conformal CVD process which forms a TEOS liner layer to fill the cavities 208A, 208B with the replacement oxide layers 209A, 209B. Subsequently, the shallow trench isolation (STI) structures 210A-210C are formed by depositing one or more insulation layers (e.g., by depositing high density plasma oxide) to fill the trenches 207A-C, and any oxide layer(s) on the top of the semiconductor structure 11 may be optionally polished or etched to form the STI structures 210A-C. As formed, the replacement oxide layers 209A, 209B continue to provide a barrier to updiffusion of Arsenic dopants from the first or lower n-type epitaxial collector layer 203 at the periphery of the active collector region and adjacent to the STI structures 210A, 210B of the finally-formed HBT device.

Figure 12:
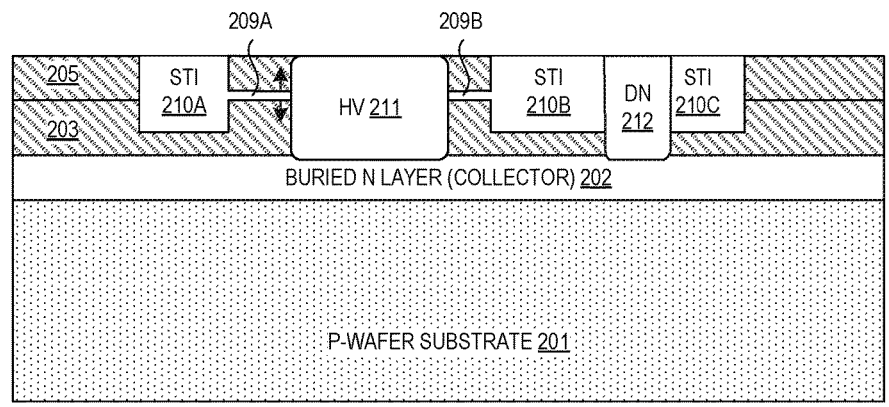

Subsequently and as shown in FIG. 12, the semiconductor structure 12 is implanted to form a high voltage (HV) region 211 and deep n-well or sinker body region 212 in the n-epi collector layers 203, 205 using any suitable fabrication steps. For example, the HV body region 211 may be formed by using a first implant mask to selectively diffuse or implant n-type impurities into the underlying n-epi collector layers 203, 205 to be positioned centrally in the active collector region and to contact the buried n-type collector layer 202. In similar fashion, the n-type sinker well or body regions 212 may be formed by using a second implant mask to selectively diffuse or implant n-type impurities (e.g., Phosphorous) into the underlying n-epi collector layers 203, 205 to contact the underlying buried n-layer 202 at a location outside of the active collector region. As will be appreciated, any thermal processing used in the formation of the high voltage (HV) region 211 and deep n-well or sinker body region 212 will not result in significant updiffusion of the n-type impurities from the buried n-layer 202 or lower n-epi collector layer 203 since the oxide replacement layers 209A, 209B are positioned to prevent or reduce dopant migration into the upper n-epi collector layer 205 at the periphery of the active collector region and adjacent to the STI structures 210A, 210B of the finally-formed HBT device.

Figure 13:
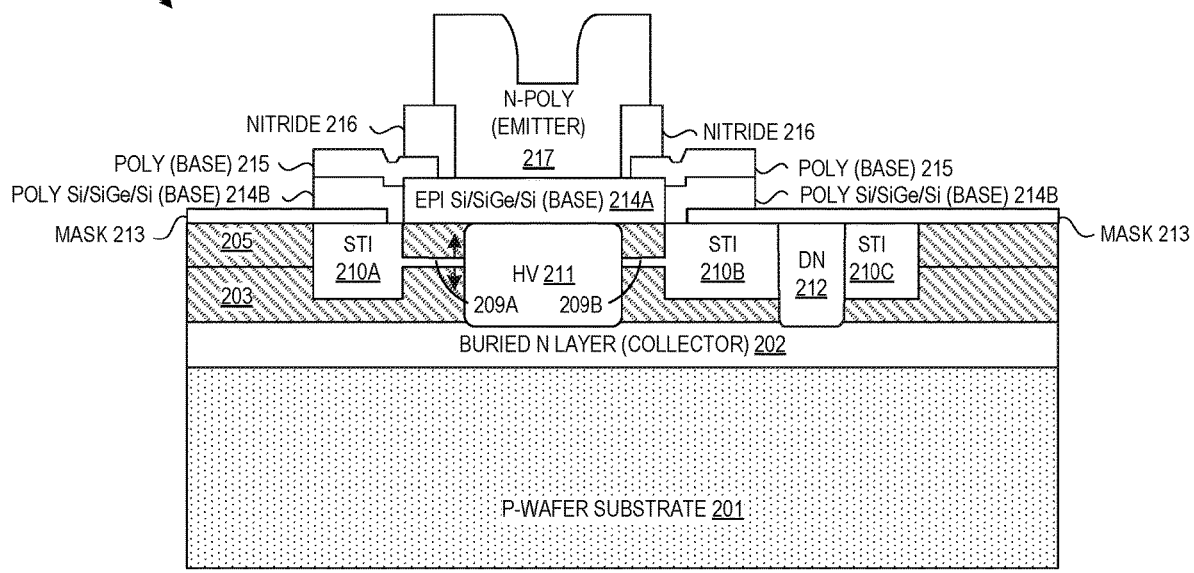
Figure 14:
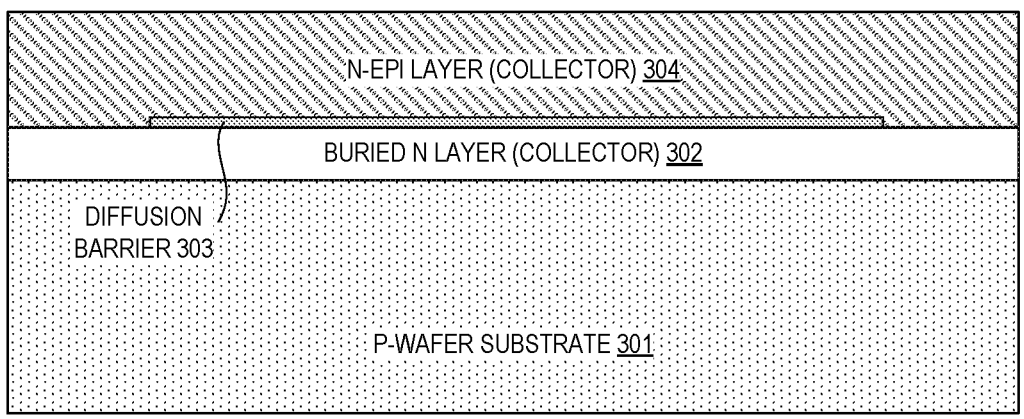
FIGS. 14-23 illustrate cross sectional views of a third sequence of steps for fabricating HBT devices wherein a sacrificial diffusion barrier layer in the collector region is replaced with a replacement oxide layer before forming the base and emitter regions, and wherein the replacement oxide layer is replaced with a polysilicon or metal layer after forming the base and emitter regions in accordance with selected embodiments of the present disclosure.

Subsequently and as shown in FIG. 13, additional processing steps are applied to the semiconductor structure 13 to form the base regions 214, 215 and emitter regions 217 using any suitable fabrication steps, such as those described above with reference to FIG. 6. For example, a first patterned mask 213 may be formed on the semiconductor structure 13 to define one or more mask openings over the upper n-type epitaxial collector layer 205 where the base region is to be formed. Subsequently, the SiGe base stack 214 is formed in the mask opening to include a monocrystalline epitaxial stack portion 214A above the collector region and a polycrystalline stack portion 214B above the shallow trench isolation regions 210A, 210B. In addition, a poly base layer 215 is formed on the SiGe base stack 214A/B to connect the p-type epitaxial SiGe layer in the SiGe base stack 214A/B to an extrinsic base contact. After patterning and etching the p-type SiGe base stack 214A/B and poly base layer 215, one or more selective etches are applied to expose the epitaxial SiGe base stack 214A over the active collector region and to remove the p-type SiGe base stack 214A/B and poly base layer 215 from areas outside of the HBT device area. Subsequently, an n-type emitter region may be formed with a patterned n-type polysilicon layer 217 that is electrically isolated from the p-type base layers 214, 215 by means of nitride spacers 216 using any suitable fabrication steps.

In accordance with selected embodiments of the present disclosure, the replacement oxide layers 209A, 209B may be positioned at different depths in the n-type epitaxial collector layers 203, 205 to confine buried layer updiffusion to the central part of the collector region in the HBT device and to prevent or reduce buried layer updiffusion at the periphery of the active collector region and adjacent to the STI structures 210A, 210B of the finally-formed HBT device. For example, by positioning the replacement oxide layers 209A, 209B deeper in the n-type epitaxial collector layers 203, 205 (e.g., toward the bottom of the STI structures 210A, 210B), buried layer updiffusion is limited only in the extrinsic or peripheral edges of the HBT collector region, thereby reducing strain-enhanced Arsenic updiffusion along the edges of the STI structures 210A, 210B which may cause ICBO/ACEO yield loss. Alternatively, by positioning the replacement oxide layers 209A, 209B closer to the upper surface in the n-type epitaxial collector layer 205 (e.g., toward the top of the STI structures 210A, 210B), the base-collector capacitance $C_{BC}$ is reduced, thereby increasing the maximum oscillation frequency $f_{MAX}$ figure of merit for HBT devices.

As disclosed herein, the SiGe barrier layer may be formed at different depths and positions in the collector region, and may also be replaced with a replacement oxide layer to provide localized diffusion barrier functions that improve HBT device performance. While the replacement oxide layer may be retained without impairing the HBT device function, there are certain applications where the replacement oxide layer could impede device functionality, such as when the replacement oxide layer creates a break in the conductive collector region. In such embodiments, the replacement oxide layer may be replaced with a conductive layer, such as a conductive polysilicon or metal layer, thereby electrically connecting the collector region(s) together. To provide additional details for an improved understanding of selected embodiments of the present disclosure, reference is now made to FIGS. 14-23 which depict cross sectional views of a third sequence of steps for fabricating HBT devices wherein a sacrificial barrier layer in the collector region is replaced with a replacement oxide layer before forming the base and emitter regions, and wherein the replacement oxide layer is replaced with a polysilicon or metal layer after forming the base and emitter regions.

The starting point (see FIG. 14) is semiconductor structure 14 having a p-type silicon wafer substrate 301 on which is formed a buried n-type collector layer 302 using any suitable fabrication steps, such as those described above with reference to layers 101, 102 in FIG. 3. On the buried n-type collector layer 302, a barrier layer 303 is selectively formed to a predetermined thickness. For example, the barrier layer 303 may be formed by using a controlled process to grow or otherwise form an epitaxial layer of silicon germanium (SiGe) to a predetermined thickness, such as by depositing a SiGe layer with a chemical vapor deposition process which uses GeH4 and SiH4 or SiH2Cl2 as sources at a reduced pressure (e.g., 5-20 Torr) and specified temperature (e.g., 500 to 700°) for sufficient time to form the desired thickness of the SiGe layer (e.g., 20 nm). As will be appreciated, other precursor gases, pressure, temperature, time, and thickness values may be used. As disclosed herein, the diffusion blocking function of the SiGe barrier layer 303 effectively results from the chemical vapor deposition (CVD) process used to form the SiGe barrier layer 303 which exposes the surface of the buried n-type collector layer 302 to germane (GeH4), thereby promoting desorption of Arsenic from the buried n-type collector layer 302 at the surface of that layer.

As disclosed herein, the barrier layer 303 may be selectively formed as patterned sacrificial SiGe barrier layer in specified areas of the buried n-type collector layer 302 without extending into the regions where the deep trench isolation structures are finally formed. To selectively form the patterned sacrificial SiGe barrier layer 303, a patterned oxide mask (not shown) is formed on the buried n-type collector layer 302 which includes openings exposing the underlaying buried n-type collector layer 302 where the patterned sacrificial SiGe barrier layer 303 is to be formed. Subsequently, the SiGe epitaxial growth process is performed with the patterned oxide mask in place to form the patterned sacrificial SiGe barrier layer 303 to a predetermined germanium content (e.g., an atomic percentage of 10-25%) and thickness (e.g., between 5-100 nm), though any suitable materials and thicknesses may be used, provided that the material properties of the barrier layer 303 includes the ability to prevent or reduce impurity updiffusion from the buried n-type collector layer 302 during subsequent fabrication processing steps. After removing the patterned oxide mask to leave the patterned sacrificial SiGe barrier layer 303 and exposed underlying buried n-type collector layer 302, an n-type epitaxial collector layer 304 is deposited or grown by epitaxy to a predetermined depth.

Figure 15:
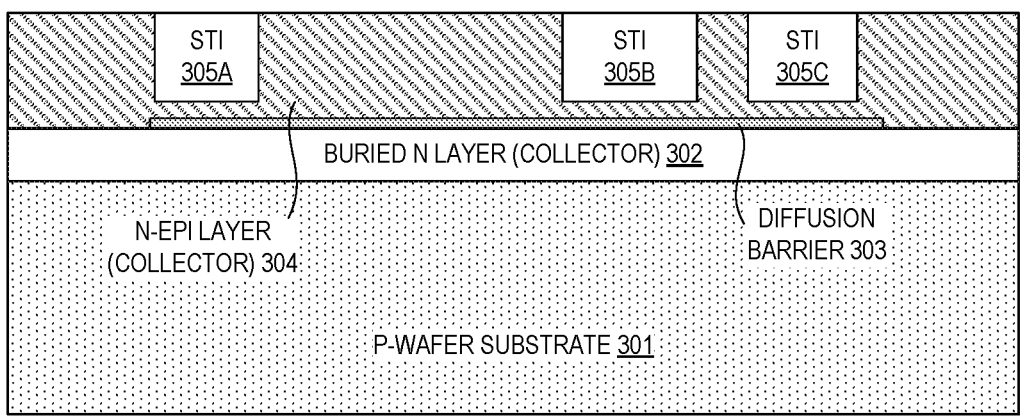

Subsequently, and as shown in FIG. 15, electrically insulating shallow trench isolation (STI) structures 305A-C are formed on the semiconductor structure 15 using any suitable fabrication step. For example, a patterned etch mask layer (not shown) may be formed on the n-type epitaxial collector layer 304 to define mask openings where a selective reactive-ion etching (RIE) step is applied to etch shallow trenches that are subsequently filled with one or more insulation layers (e.g., by depositing high density plasma oxide) and optionally polished or etched to form the STI structures 305A-C. As depicted, the STI structures 305A-C extend only partway down to the buried the n-type collector layer 302 and do not reach the barrier layer 303.

Figure 16:
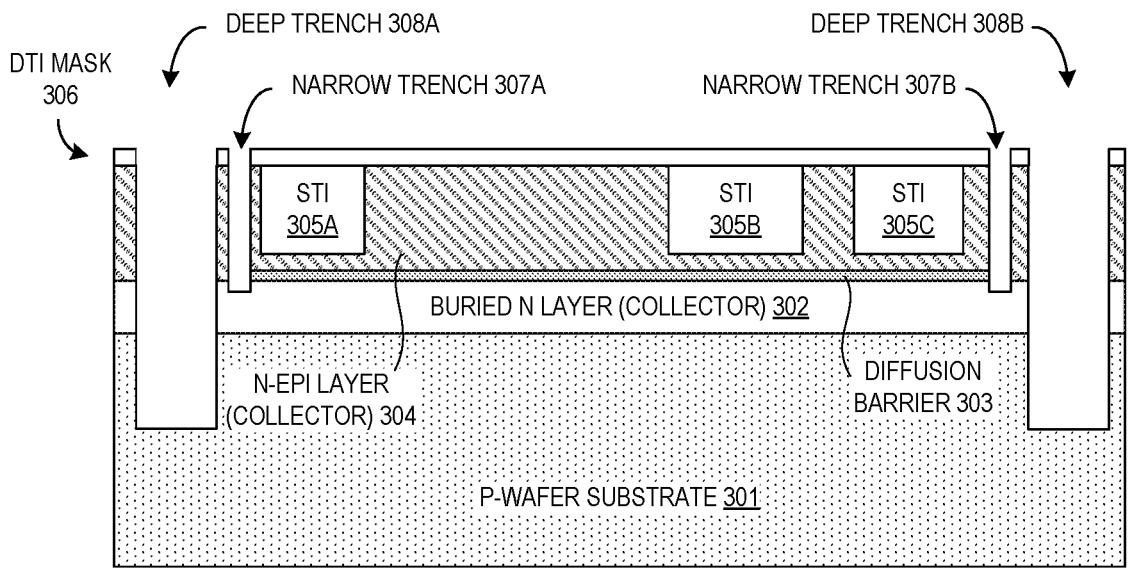

Subsequently, and as shown in FIG. 16, a plurality of narrow trenches 307A-B and deep trenches 308A-B are formed in the semiconductor structure 16 using any suitable sequence of processing steps. For example, a patterned masking layer of oxide and/or nitride 306 may be formed on the n-type epitaxial collector layer 304 to define mask openings where narrow trenches 307A-B and deep trenches 308A-B are etched into n-type epitaxial collector layer 304 to a predetermined depth. By controlling the widths of the mask openings in the patterned mask 306 so that there are narrower openings for the narrow trenches 307 and wider openings for the deeper trenches 308, a selective etch process is applied to simultaneously form both the narrow trenches 307A-B and deep trenches 308A-B with one or more reactive-ion etching (RIE) steps having suitable etch chemistry properties to remove at least the n-type epitaxial collector layer 304. As depicted, the relative lateral positioning of the openings in the mask 306 are controlled so that the etched narrow trenches 307A-C align with and access the barrier layer 303 on at least one side, and so that the etched deep trenches 308A-C do not access the barrier layer 303.

Figure 17:
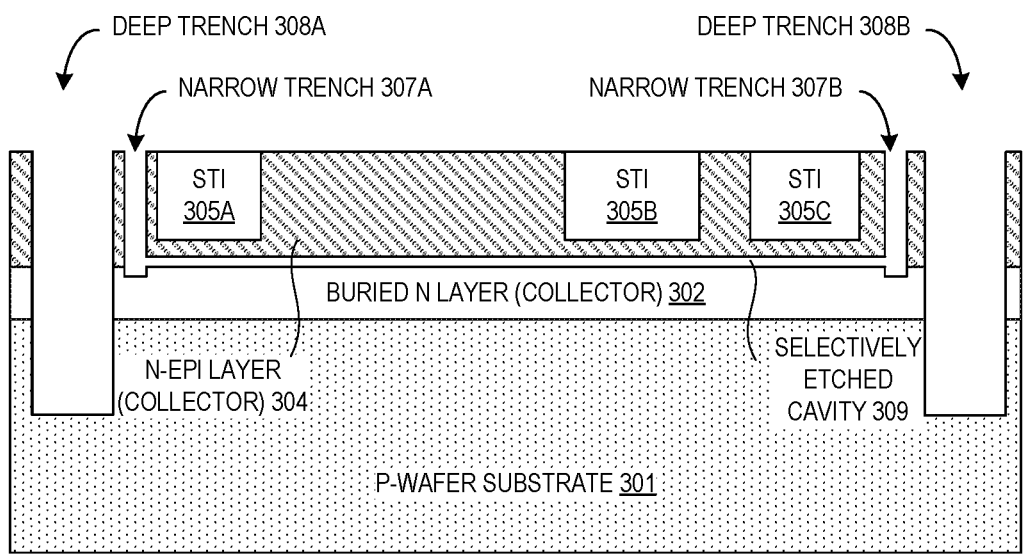

Subsequently, and as shown in FIG. 17, a selective etch is applied to the semiconductor structure 17 to etch away the barrier layer 303, leaving the selectively etched cavity 309. In selected embodiments, the selective etching of SiGe may be implemented by using any suitable anisotropic epitaxial silicon etch process, such as a selective dry etching step with atomic fluorine or an isotropic reactive ion etch (RIE) which selectively removes the barrier layer 303 without etching the n-type epitaxial collector layer 304 or the buried n-type collector layer 302.

Figure 18:
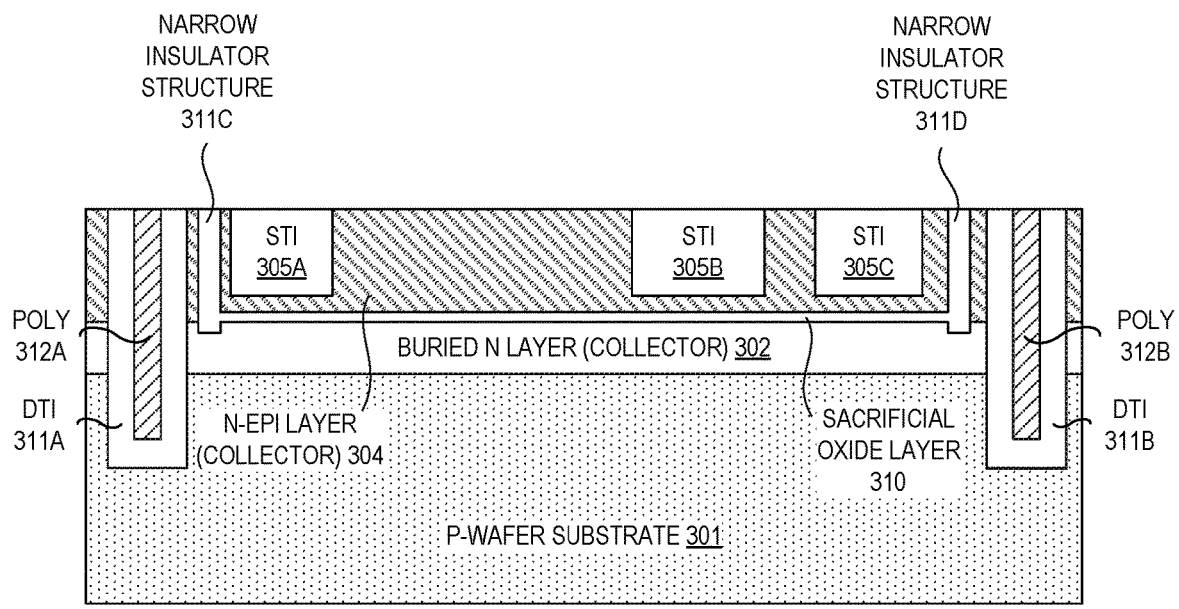

Subsequently, and as shown in FIG. 18, an oxidation process is applied to the semiconductor structure 17 to fill the trenches 307, 308 and cavity 309 by forming one or more oxide layers to form a replacement or sacrificial oxide layer 310 and a conformal oxide layer 311 which fills the narrow trenches 307A-B with a narrow insulator structure 311C-D and at least part of the deep trenches 308A-B with a deep trench isolation structure 311A-B. For example, a first oxide liner layer may be formed on the surfaces of the trenches 307, 308 and cavity 309 as a conformal dielectric layer formed with a first dielectric material (e.g., hafnium oxide) using an oxide formation process which fills the cavity 309 and at least part of the narrow trenches 307 without completely filling the deep trenches 308, such as by using an ALD oxide deposition process, a conformal CVD process which forms a TEOS liner layer, or other suitable oxide deposition process. In addition, one or more additional insulation layers may be formed (e.g., by depositing high density plasma oxide) to fill the narrow trenches 307 and form a conformal deep trench isolation layer 311A-B on the sidewalls of the deep trenches. In addition, the centers of the deep trenches may be filled with a polysilicon layer 312A-B, such as by depositing a doped, conductive polysilicon layer. Once the narrow and deep trenches are filled, an optional polish or etch process may be applied to planarize the DTI structures 311A/B-312A/B and narrow isolation structures 311C/D. As will be appreciated, any thermal processing used in the formation of the DTI structures 311A/B-312A/B and narrow isolation structures 311C/D will not result in significant updiffusion of the n-type impurities from the buried n-layer 302 since the barrier layer 303 is positioned to prevent or reduce dopant migration into the n-epi collector layer 304. Again, the HBT device will benefit if the updiffusion is reduced by the barrier layer 303, and the updiffusion does not need to be fully blocked.

Figure 19:
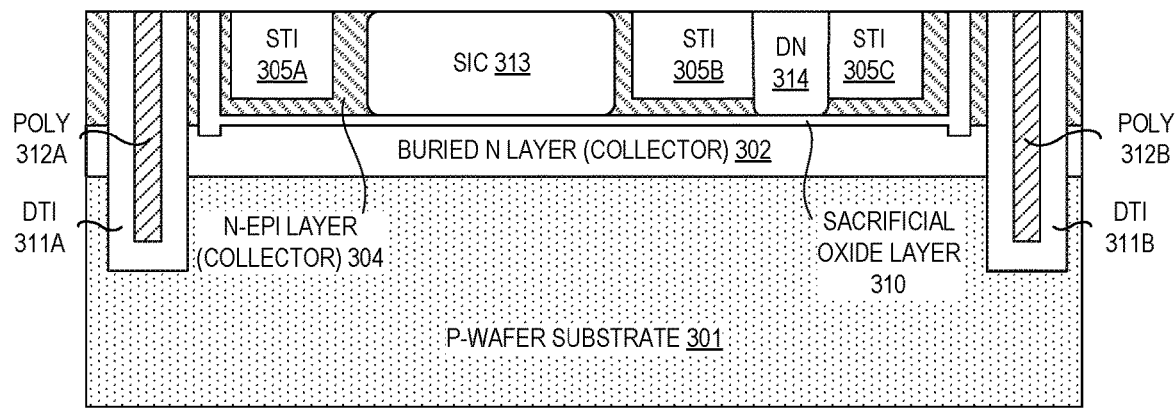

Subsequently and as shown in FIG. 19, the semiconductor structure 19 is implanted to form a selectively implanted collector (SIC) region 313 and deep n-well or sinker region 314 in the n-epi collector layer 304 using any suitable fabrication steps. For example, the SIC body region 313 may be formed by using a first implant mask to selectively diffuse or implant n-type impurities into the underlying n-epi collector layer 304 to be positioned centrally in the active collector region and to contact the buried n-type collector layer 302. In similar fashion, the n-type sinker well or body regions 314 may be formed by using a second implant mask to selectively diffuse or implant n-type impurities (e.g., Phosphorous) into the underlying n-epi collector layer 304 so as to contact the underlying buried n-layer 302 at a location outside of the active collector region. As will be appreciated, any thermal processing used in the formation of the SIC region 313 and deep n-well or body region 314 will not result in significant updiffusion of the n-type impurities from the buried n-layer 302 since the replacement oxide layer 310 is positioned to prevent or reduce dopant migration into the n-epi collector layer 304 of the finally-formed HBT device.

Figure 20:
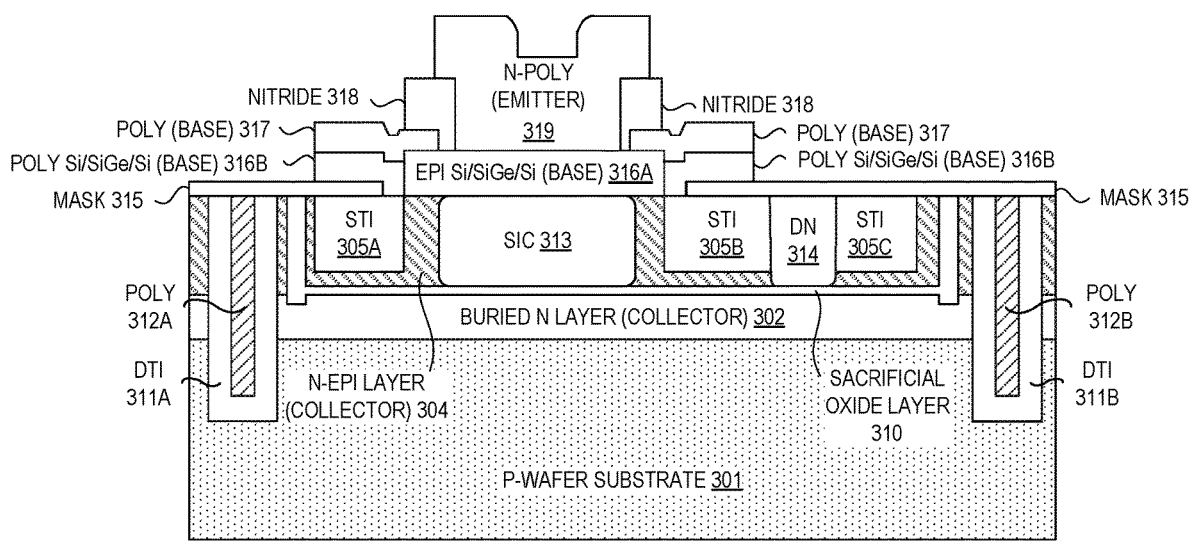

Subsequently, and as shown in FIG. 20, additional processing steps are applied to the semiconductor structure 20 to form the base regions 316, 317 and emitter regions 319 using any suitable fabrication steps, such as those described above with reference to FIG. 6. For example, a first patterned mask 315 may be formed on the semiconductor structure 20 to define one or more mask openings over the n-type epitaxial collector layer 304 where the base region is to be formed. Subsequently, the SiGe base region 316 is formed in the mask opening to include a monocrystalline epitaxial stack portion 316A above the collector region and a polycrystalline stack portion 316B above the shallow trench isolation regions 305A, 305B. In addition, a poly base layer 317 is formed on the SiGe base stack 316A/B to connect the p-type epitaxial SiGe layer in the SiGe base stack 316A/B to an extrinsic base contact. After patterning and etching the p-type SiGe base stack 316A/B and poly base layer 317, one or more selective etches are applied to expose the epitaxial SiGe base stack 316A over the active collector region and to remove the p-type SiGe base stack 316A/B and poly base layer 317 from areas outside of the HBT device area. Subsequently, an n-type emitter region may be formed with, for example, a patterned n-type polysilicon layer 319 that is electrically isolated from the p-type base regions 316, 317 by means of nitride spacers 318 using any suitable fabrication steps.

Figure 21:
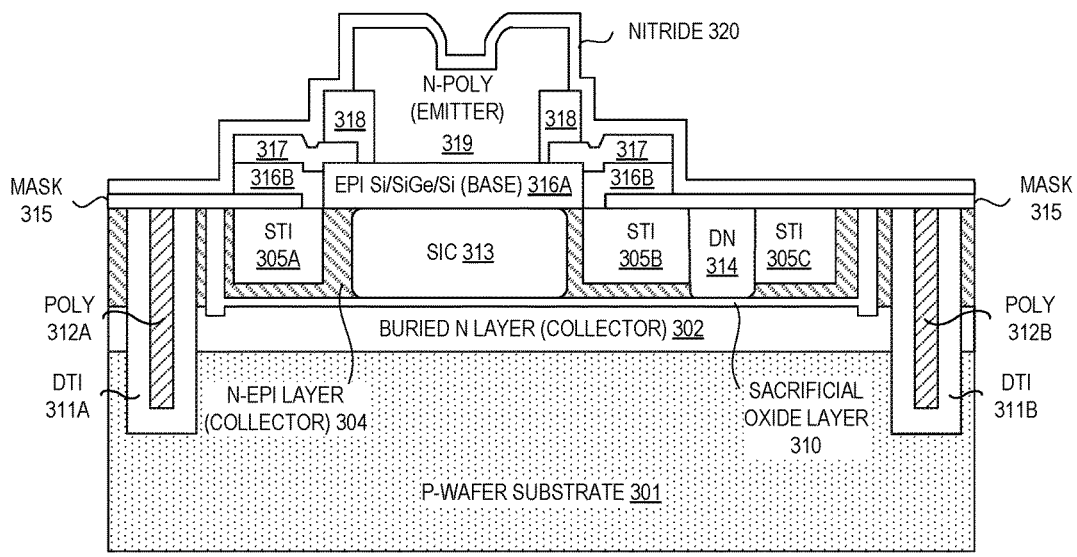

Subsequently, and as shown in FIG. 21, a protective layer 320 is formed over the semiconductor structure 21 to protect against subsequent processing. For example, the protective layer 320 may be formed by depositing a thin nitride layer to conformally cover the semiconductor structure 21.

Figure 22:
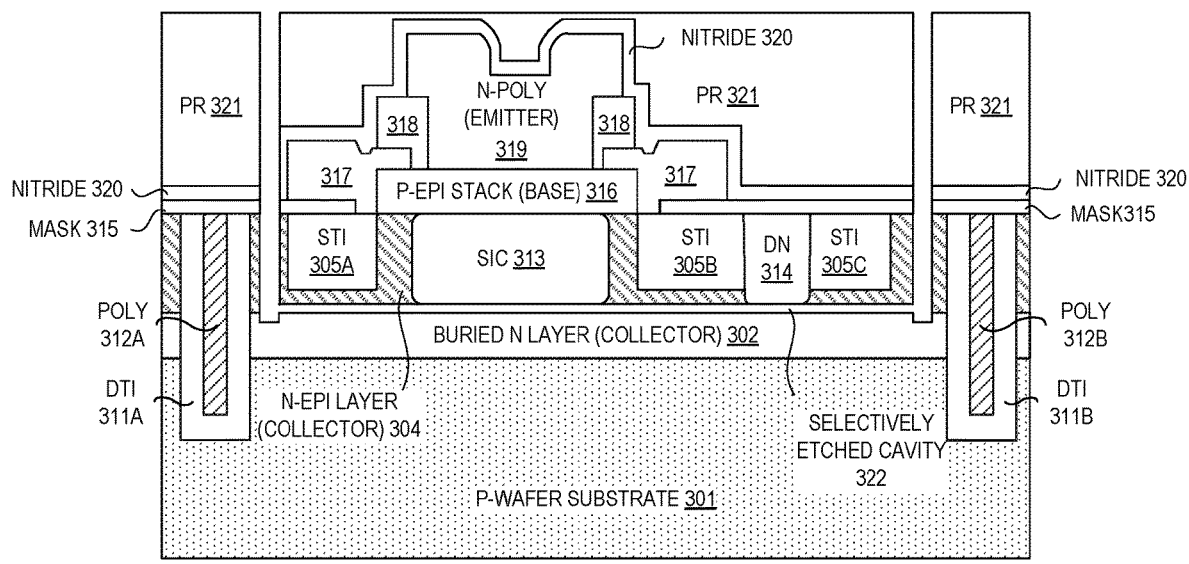

Subsequently, and as shown in FIG. 22, the semiconductor structure 22 is patterned and etched to access and remove the replacement oxide layer 310 and the narrow insulator structures 311C-D, thereby forming a selectively etched cavity 322. While any suitable pattern and etch process may be used, a first patterned mask 321 may be formed over the semiconductor structure 22 by depositing, patterning, etching, or developing a photoresist or hard mask layer on the protective nitride layer 320 to define mask openings where narrow insulator structures 311C-D are located. With the patterned photoresist mask 321 in place, one or more etch processes are applied to remove the narrow insulator structures 311C-D and the replacement oxide layer 310. The etch processing can include using the patterned photoresist mask 321 to perform a sequence of reactive-ion etching (RIE) steps having suitable etch chemistry properties, including a wet etch using HF acid, to selectively remove, in sequence, the exposed portions of the protective nitride layer 320, mask layer 315, and underlying narrow insulator structures 311C-D and replacement oxide layer 310. By positioning the first patterned mask 321 to etch the narrow insulator structures 311C-D for accessing the replacement oxide layer 310 which is located only on an interior side of the narrow insulator structures 311C-D, any applied oxide etch process will not affect the existing DTI structures 311A-B since the sacrificial oxide layer 310 is not connected to the DTI structures 311A-B.

Figure 23:
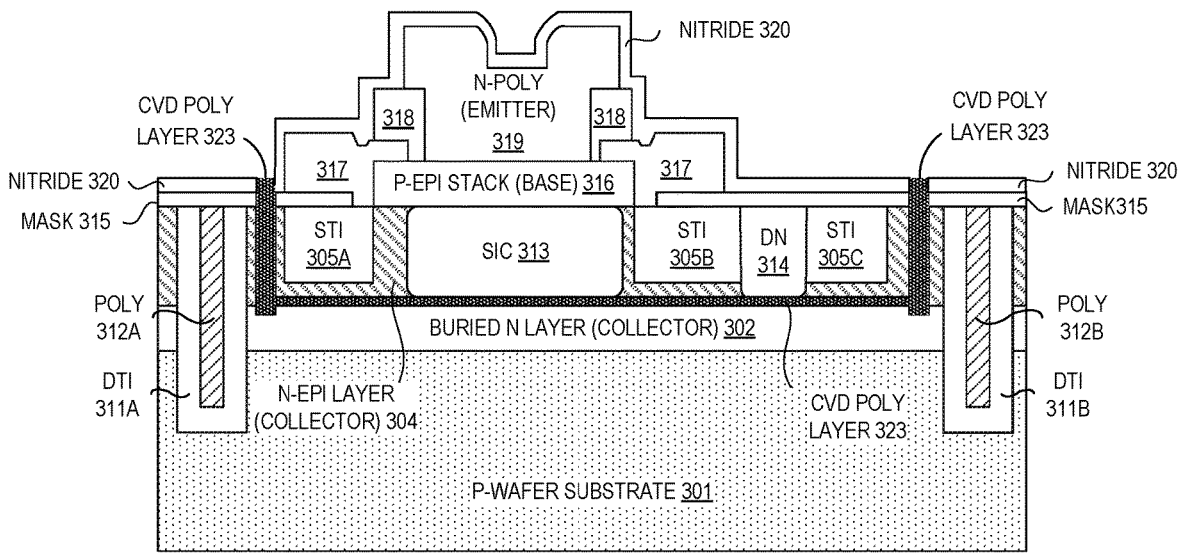

Subsequently, and as shown in FIG. 23, the patterned photoresist mask 321 is removed or stripped from the semiconductor structure 23 and a conductive layer 323 is formed to fill the selectively etched cavity 322 using any suitable fabrication steps. In selected embodiments, the conductive layer 323 may be formed by depositing polysilicon using a CVD silicon deposition process that is selective to nitride. In other embodiments, an epitaxial reactor may be used to deposit a silicon fill layer 323, although perfect epitaxy would not necessarily be needed. To prevent lift-off, anchoring could be designed in the third dimension. As will be appreciated, the replacement of the sacrificial oxide layer 310 by the conductive CVD poly layer 323 is done after a considerable part of the thermal budget of the fabrication process is completed. For example, it could be done right after patterning of the extrinsic base, after the full HBT processing is complete, or shortly before silicidation contacts are formed to the collector, base, and emitter regions. As will be appreciated, the CVD poly layer 323 will not have the diffusion barrier properties of silicon germanium, and because of its location in the collector region, a limited amount of updiffusion from the buried n-type collector layer 302 (e.g., during the final S/D anneal) will ensure that the SIC region 313 and n-type sinker well or body regions 314 are properly connected to the buried n-type collector layer 302.

In other embodiments, the conductive layer 323 may be formed with a CVD metal layer, such as CVD tungsten. However, the formation of the CVD metal layer 323 would be done later in the fabrication process to avoid any damage from thermal processing steps. For example, the replacement of the sacrificial oxide layer 310 with a CVD metal layer 323 could occur after etching contact trenches, and would require an access trench separate from the DTI structures 311-312 to access and remove the sacrificial oxide layer 310 and to fill it with a CVD metal layer.

Figure 24:
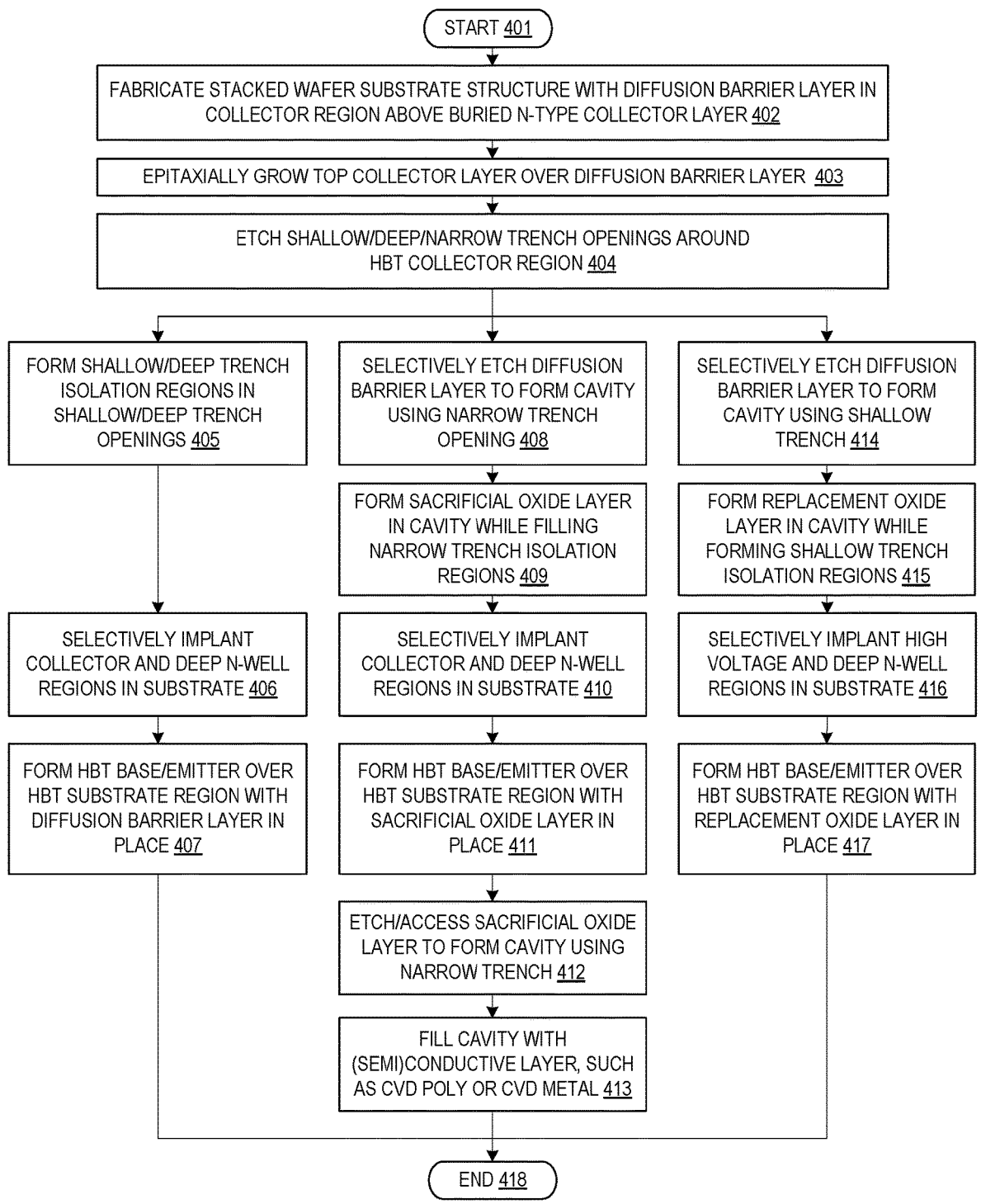
FIG. 24 illustrates a simplified process flow for fabricating HBT devices in accordance with selected embodiments of the present disclosure.

Turning now to FIG. 24, there a simplified process flow 400 for fabricating HBT in accordance with selected embodiments of the present disclosure is illustrated. After the process starts (step 401), a stacked wafer substructure is fabricated or provided (step 402) with one or more barrier layers formed in a collector region above buried n-type collector layer. As disclosed herein, the relative position and content of the barrier layer(s) can vary, but generally includes a silicon germanium layer that is formed on the n-type buried layer or within the n-type epitaxial collector layer, and may extend partially or fully across the collector region.

At step 403, an upper or top collector layer is epitaxially grown over the barrier layer(s). In selected embodiments, the top collector layer is formed as an n-type epitaxial layer which, in combination with the buried n-type collector layer, forms the collector region of the HBT device.

At step 404, trench openings are etched into the HBT collector using any suitable patterned etch processing steps. As disclosed herein, the trench openings may include shallow trench openings (in which STI structures are formed), deep trench openings (in which DTI structures are formed), and/or narrow trench openings (in which narrow insulator structures are formed). Each different type of trench opening may require a separate patterned etch mask and etch process (es) to properly position the location and depth of the corresponding trench for its intended function as specified in the remaining fabrication steps.

For example, a first sequence of fabrication may be used to fabricate HBT devices with a barrier layer formed in the collector region, starting by forming shallow trench isolation regions in the shallow trench openings and/or deep trench isolation regions in the deep trench openings (step 405). The formation of shallow or deep trench isolation regions may include depositing and planarizing one or more insulator layers to fill the shallow or deep trench openings. Subsequently, n-type regions may be formed or implanted into the substrate (step 406) to separately form a selectively implanted collector (SIC) region and deep n-well region the collector region. The formation of the SIC and deep n-well regions may include using separate patterned implant masks and implantation steps. Subsequently, the HBT base and emitter regions may be formed on the HBT collector region while retaining the barrier layer in place (step 407). In such embodiments, the barrier layer may be a thin silicon germanium barrier layer that extends fully across the HBT collector region, and that is not removed from the HBT device to provide an electrical connection between the upper n-type epitaxial collector layer and the buried n-type collector layer.

In addition, a second sequence of fabrication may be used to fabricate HBT devices by replacing the barrier layer(s) in the collector region with a replacement oxide layer before forming the base and emitter regions, and by replacing the replacement oxide layer with a polysilicon or metal layer after forming the base and emitter regions. The second sequence starts by using one or more of the narrow trench openings to selectively etch or remove the barrier layer(s) from the collector region and form a cavity (step 408). By positioning the narrow trench opening to access the peripheral end(s) of the barrier layer, the selective etch process at step 408 does not also etch any adjacent deep trench isolation regions formed outside of the HBT collector region. Subsequently, a sacrificial oxide layer is formed by filling the cavity while filling the narrow trench openings (step 409). The formation of deep trench isolation regions may include depositing and planarizing one or more insulator layers to fill the deep trench openings. Subsequently, n-type regions may be formed or implanted into the substrate (step 410) to separately form a selectively implanted collector (SIC) region and deep n-well region the collector region. The formation of the SIC and deep n-well regions may include using separate patterned implant masks and implantation steps. Subsequently, the HBT base and emitter regions may be formed on the HBT collector region while retaining the sacrificial oxide layer in place (step 411). Subsequently, the sacrificial oxide layer may be accessed and etched using one or more of the narrow trench openings to selectively etch or remove the sacrificial oxide layer from the collector region and form a cavity (step 412). Subsequently, a conductive layer is formed to fill the cavity, such as by CVD poly or CVD metal during a late stage of the fabrication process (step 413). In such embodiments, the silicon germanium barrier layer and replacement oxide layer may extend fully across the HBT collector region to provide an updiffusion barrier function, and may be replaced by a (semi)conductive layer, such as CVD poly or metal layer in the fabrication process only after considerable part of the thermal budget has passed.

In addition, a third sequence of fabrication may be used to fabricate HBT devices with a sacrificial barrier layer formed in the collector region that is replaced with a replacement oxide layer before forming the base and emitter regions. The third sequence starts by using one or more of the shallow trench openings to selectively etch or remove the barrier layer(s) from the collector region and form a cavity (step 414). By positioning the shallow trench opening to access the peripheral end(s) of the barrier layer, the selective etch process at step 414 does not also etch any adjacent deep trench isolation regions formed outside of the HBT collector region. Subsequently, a replacement oxide layer is formed by filling the cavity during formation of the shallow trench isolation regions in the shallow trench openings (step 415). The formation of shallow trench isolation regions may include depositing and planarizing one or more insulator layers to fill the shallow trench openings. Subsequently, n-type regions may be formed or implanted into the substrate (step 416) to separately form a high voltage (HV) region and deep n-well region the collector region. The formation of the HV and deep n-well regions may include using separate patterned implant masks and implantation steps. Subsequently, the HBT base and emitter regions may be formed on the HBT collector region while retaining the replacement oxide layer in place (step 417). In such embodiments, the silicon germanium barrier layer and replacement oxide layer may not extend fully across the HBT collector region, but instead are located only on the peripheral sides near the STI regions to provide a localized updiffusion barrier function at the periphery of the active collector region but not at the center of the active collector region.

At step 418, the processing ends for each of the fabrication sequences, though additional processing steps can be performed to complete the fabrication of the HBT devices into functioning devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the HBT devices may vary, depending on the process and/or design requirements.

By now it should be appreciated that there has been provided a method for forming a HBT semiconductor device in a BiCMOS process flow by forming a barrier layer in the substrate collector region which prevents up-diffusion of n-type doping concentrations from a buried collector layer. In the disclosed method, a semiconductor collector region is formed in a substrate, where the semiconductor collector region includes a lower collector layer, a barrier layer formed on the lower collector layer, and an upper collector layer formed on at least the barrier layer. As formed, the barrier layer is positioned and structured to reduce diffusion of dopants from the lower collector layer into the upper collector layer during one or more subsequent manufacturing steps. The disclosed method also forms a trench isolation region in the substrate that insulates the semiconductor collector region. In selected embodiments, the trench isolation region may be formed by etching one or more trench openings in the substrate which are positioned to surround the semiconductor collector region; depositing one or more insulator layers to fill the one or more trench openings; and planarizing the one or more insulator layers with the substrate to form the trench isolation region. In addition, the disclosed method selectively forms a heterogeneous base region on a portion of the semiconductor collector region by forming a heterogeneous stack of epitaxial semiconductor layers. Finally, the disclosed method selectively forms a silicon emitter region on the heterogeneous base region.

In selected embodiments, the formation of the semiconductor collector region includes forming the lower collector layer as a buried collector layer in the substrate, and then forming the barrier layer as an epitaxial silicon germanium layer with a chemical vapor deposition process using germane as a precursor to promote desorption of dopants from the buried collector layer at a surface of that layer. In selected second embodiments, the formation of the semiconductor collector region includes forming the lower collector layer as an epitaxial collector layer formed on a buried collector layer in the substrate, and then forming the barrier layer as a patterned epitaxial silicon germanium layer formed on the epitaxial collector layer at peripheral sides of the semiconductor collector region and adjacent to the trench isolation region. In selected embodiments, the barrier layer is formed as an epitaxial silicon germanium layer using a chemical vapor deposition process that is configured to promote desorption of dopants from a surface of the buried collector layer during formation of the epitaxial silicon germanium layer on the surface of the buried collector layer. In selected embodiments, the barrier layer is an epitaxial silicon germanium layer that is formed with a chemical vapor deposition process which uses a germanium hydride precursor that also promotes desorption of dopants from the buried collector layer at a surface of that layer. In such embodiments, the patterned epitaxial silicon germanium layer may be positioned closer to a top surface of the upper collector layer than to a bottom surface of the epitaxial collector layer. This positioning of the patterned epitaxial silicon germanium layer near the top surface of the upper collector layer will reduce a base-collector capacitance ("$C_{BC}$") of the heterojunction bipolar transistor. Alternatively, the patterned epitaxial silicon germanium layer may be positioned closer to a bottom surface of the epitaxial collector layer than to a top surface of the upper collector layer region. This positioning of the patterned epitaxial silicon germanium layer closer to the bottom surface of the epitaxial collector layer will reduce strain-enhanced dopant diffusion along only the edges of the trench isolation region. In addition, the patterned epitaxial silicon germanium layer may be replaced with a replacement oxide layer, such as by etching or otherwise removing the patterned epitaxial silicon germanium layer to form a cavity, and then depositing one or more oxide layers to fill the cavity while forming the trench isolation region. In addition, the replacement oxide layer may be replaced with a conductive layer or semiconductive layer after forming the silicon emitter region, such as by etching or otherwise removing the replacement oxide layer to form a second cavity, and then depositing one or more conductive layers or one or more semiconductive layers to fill the second cavity after forming the trench isolation region.

In another form, a semiconductor device having a heterojunction bipolar transistor has been provided. As disclosed, the semiconductor device includes a semiconductor substrate. The disclosed semiconductor device also includes a collector region located in the semiconductor substrate, where the collector region includes a lower collector layer, a dopant barrier layer located on the lower collector layer, and an upper collector layer located on at least the dopant barrier layer, where the dopant barrier layer is configured to limit diffusion of dopants from the lower collector layer into the upper collector layer during fabrication of the semiconductor device. In selected embodiments, the lower collector layer includes an n-type buried collector layer formed in the semiconductor substrate, and the dopant barrier layer include an epitaxial silicon germanium layer formed on the n-type buried collector layer. In addition, in selected embodiments, the epitaxial silicon germanium layer contains an atomic percentage of 10-25% germanium and/or has a thickness between 5-100 nm. In addition, the disclosed semiconductor device includes a heterogeneous base region located on top of the collector region, where the heterogeneous base region includes a first semiconductor layer sandwiched between a second and third semiconductor layers, where the first semiconductor layer is formed with a material (e.g., SiGe) that is different from a material forming the second and third semiconductor layers (e.g., Si). In selected embodiments, the epitaxial silicon germanium layer includes a stack of Si/SiGe:C/Si layers.

The disclosed semiconductor device also includes an emitter region located on the heterogeneous base region. Finally, the disclosed semiconductor device also includes a trench isolation region positioned in the semiconductor substrate to insulate the collector region. In selected embodiments, the lower collector layer is a buried n-type collector layer having a peak n-type doping concentration of approximately $1 \times 10^{20}$ cm$^{-3}$, and where the upper collector layer is an n-type epitaxial collector layer having an n-type doping concentration of approximately $1 \times 10^{16}$ cm$^{-3}$ within a distance measured by a width of the dopant barrier layer.

In yet another form, there has been provided a semiconductor device having a heterojunction bipolar transistor. As disclosed, the semiconductor device includes a semiconductor substrate and a trench isolation region positioned in the semiconductor substrate to insulate the heterojunction bipolar transistor. In addition, the semiconductor device includes a collector region located in the semiconductor substrate which includes a lower collector layer, a barrier layer formed on the lower collector layer, and an upper collector layer formed on at least the barrier layer, where the dopant barrier layer is configured to limit diffusion of dopants from the lower collector layer into the upper collector layer during fabrication of the semiconductor device. As formed, the barrier layer is located at a periphery, but not at a center, of the collector region to be adjacent to the trench isolation region to reduce diffusion of dopants from the lower collector layer into the upper collector layer in areas adjacent to the trench isolation region. The disclosed semiconductor device also includes a heterogeneous base region located on top of the collector region, where the heterogeneous base region includes a first semiconductor layer sandwiched between a second and third semiconductor layers. Finally, the semiconductor device includes a silicon emitter region located on the heterogeneous base region.

In selected embodiments, the lower collector layer includes an n-type epitaxial collector layer formed on an n-type buried collector layer in the semiconductor substrate, and the barrier layer includes an oxide layer formed on the n-type epitaxial collector layer. In such embodiments, the oxide layer may be embodied with atomic layer deposition (ALD) oxide layer or a chemical vapor deposition (CVD) oxide layer or a tetraethyl orthosilicate (TEOS) liner layer. In addition, the oxide layer may have a thickness between 5-100 nm. In selected embodiments, the dopant barrier layer is configured to limit diffusion of dopants from the lower collector layer into the upper collector layer by using an epitaxial formation process which promotes desorption of dopants from the lower collector layer at a surface of that layer.

Although the described example embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted HBT device structures may be formed with different processing steps that can be combined and integrated, and can use other diffusion barrier materials besides silicon germanium layers or oxide layers. Also, the various constituent layers may be formed with different conductive materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of manufacturing a heterojunction bipolar transistor, comprising:
   forming a semiconductor collector region in a substrate by:
      forming a lower collector layer within the substrate;
      forming a barrier layer above the lower collector layer such that the barrier layer is configured to impede diffusion of dopants from the lower collector layer through the barrier layer during one or more subsequent manufacturing steps, wherein the barrier layer is located at peripheral sides of the semiconductor collector region, separate from a center of the semiconductor collector region; and
      forming an upper collector layer above the barrier layer;
   forming a trench isolation region in the substrate that electrically insulates the semiconductor collector region, wherein the barrier layer is adjacent to the trench isolation region;
   selectively forming a heterogeneous base region on a portion of the semiconductor collector region by forming a heterogeneous stack of semiconductor layers; and selectively forming an emitter region on a portion of the heterogeneous base region.

2. The method of claim 1, where forming the barrier layer comprises forming an epitaxial silicon germanium layer with a chemical vapor deposition process which uses germanium hydride as a precursor.

3. The method of claim 1, where forming the trench isolation region comprises:
    etching one or more trench openings in the substrate which are positioned to surround the semiconductor collector region;
    depositing one or more insulator layers to fill the one or more trench openings; and
    planarizing the one or more insulator layers with the substrate to form the trench isolation region.

4. The method of claim 1, where forming the lower collector layer comprises forming an epitaxial collector layer on a buried collector layer in the substrate.

5. The method of claim 4, where forming the barrier layer comprises:
    forming a patterned epitaxial silicon germanium layer on the epitaxial collector layer.

6. The method of claim 5, where the patterned epitaxial silicon germanium layer is positioned closer to a top surface of the upper collector layer than to a bottom surface of the epitaxial collector layer.

7. The method of claim 5, where the patterned epitaxial silicon germanium layer is positioned closer to a bottom surface of the epitaxial collector layer than to a top surface of the upper collector layer region.

8. The method of claim 5, further comprising:
    etching or otherwise removing the patterned epitaxial silicon germanium layer to form a cavity; and
    depositing one or more oxide layers to fill the cavity while forming the trench isolation region, thereby forming a replacement oxide layer.

9. The method of claim 4, further comprising:
    etching or otherwise removing the epitaxial silicon germanium layer to form a cavity; and
    depositing one or more oxide layers to fill the cavity while forming the trench isolation region, thereby forming a replacement oxide layer.

10. The method of claim 9, further comprising:
    etching or otherwise removing the replacement oxide layer to form a second cavity; and
    depositing one or more conductive layers or one or more semiconductive layers to fill the second cavity after forming the trench isolation region.

11. A semiconductor device comprising a heterojunction bipolar transistor, comprising:
    a semiconductor substrate;
    a collector region located in the semiconductor substrate comprising a lower collector layer, a barrier layer located on the lower collector layer, and an upper collector layer located on at least the barrier layer;
    a heterogeneous base region located on top of the collector region, the heterogeneous base region comprising a first semiconductor layer sandwiched between second and third semiconductor layers, where the first semiconductor layer is formed with a material that is different from a material forming the second and third semiconductor layers;
    an emitter region located on the heterogeneous base region; and
    a trench isolation region positioned in the semiconductor substrate to insulate the collector region, wherein the barrier layer is located at peripheral sides of the collector region, separate from a center of the collector region, and is adjacent to the trench isolation region.

12. The semiconductor device of claim 11, where the first semiconductor layer comprises SiGe:C, and where the second and third semiconductor layers each comprise silicon.

13. The semiconductor device of claim 11, where the barrier layer is configured to limit diffusion of dopants from the lower collector layer into the upper collector layer during fabrication of the semiconductor device.

14. A semiconductor device comprising a heterojunction bipolar transistor, comprising:
    a semiconductor substrate;
    a trench isolation region positioned in the semiconductor substrate to electrically insulate the heterojunction bipolar transistor;
    a collector region located in the semiconductor substrate comprising a lower collector layer, a barrier layer formed on the lower collector layer, and an upper collector layer formed on at least the barrier layer, and where the barrier layer is located at a periphery, but not at a center, of the collector region to be adjacent to the trench isolation region;
    a heterogeneous base region located on top of the collector region, the heterogeneous base region comprising a first semiconductor layer sandwiched between second and third semiconductor layers; and
    an emitter region located on the heterogeneous base region.

15. The semiconductor device of claim 14, where the lower collector layer comprises an n-type epitaxial collector layer formed on an n-type buried collector layer in the semiconductor substrate, and where the barrier layer comprises an oxide layer formed on the n-type epitaxial collector layer.

16. The semiconductor device of claim 15, where the oxide layer has a thickness between 5-100 nm.

* * * * *